(12) United States Patent
Kita

(10) Patent No.: US 8,638,420 B2
(45) Date of Patent: Jan. 28, 2014

(54) OPTICAL INTEGRATOR, ILLUMINATING OPTICAL DEVICE, EXPOSURE APPARATUS AND DEVICE MANUFACTURING METHOD

(75) Inventor: Naonori Kita, Saitama (JP)

(73) Assignee: Nikon Corporation, Tokyo (JP)

( * ) Notice: Subject to any disclaimer, the term of this patent is extended or adjusted under 35 U.S.C. 154(b) by 1046 days.

(21) Appl. No.: 12/529,614

(22) PCT Filed: Mar. 11, 2008

(86) PCT No.: PCT/JP2008/054399
§ 371 (c)(1),
(2), (4) Date: Oct. 28, 2009

(87) PCT Pub. No.: WO2008/126570
PCT Pub. Date: Oct. 23, 2008

(65) Prior Publication Data
US 2010/0103398 A1    Apr. 29, 2010

(30) Foreign Application Priority Data

Mar. 16, 2007   (JP) ................................. 2007-069234

(51) Int. Cl.
*G03B 27/54* (2006.01)

(52) U.S. Cl.
USPC .................... 355/67; 355/53; 355/55; 355/71

(58) Field of Classification Search
USPC ................... 355/52, 53, 55, 67–71; 359/614, 359/619–624, 626; 430/5, 8, 22, 30, 311, 430/312, 321; 250/492.1, 492.2, 492.22, 250/548
See application file for complete search history.

(56) References Cited

U.S. PATENT DOCUMENTS

| | | | |
|---|---|---|---|
| 4,733,944 A | 3/1988 | Fahlen et al. | |
| 5,098,184 A | 3/1992 | van den Brandt et al. | |
| 5,796,521 A | 8/1998 | Kahlert et al. | |
| 5,815,248 A | 9/1998 | Nishi et al. | |
| 5,963,305 A | 10/1999 | Mizouchi | |

(Continued)

FOREIGN PATENT DOCUMENTS

| | | | |
|---|---|---|---|
| EP | 1 837 895 A1 | 9/2007 | |
| EP | 1 970 943 A1 | 9/2008 | |

(Continued)

OTHER PUBLICATIONS

Tsuruta; "Oyou Kougaku (Applied Optics) II;" Jul. 20, 1990; pp. 166-167. (w/ translation).

(Continued)

*Primary Examiner* — Toan Ton
*Assistant Examiner* — Mona M Sanei
(74) *Attorney, Agent, or Firm* — Oliff & Berridge, PLC

(57) ABSTRACT

An optical integrator has a plurality of wavefront dividing elements two-dimensionally arrayed, and is so configured that a ray group obliquely incident to an optical-axis center of an entrance face of each wavefront dividing element is emitted in parallel with the optical axis from the wavefront dividing element. In each of a required number of wavefront dividing elements out of the plurality of wavefront dividing elements, at least one curved optical face of the wavefront dividing element is formed as inclined around an axis along a predetermined direction passing an optical-axis center of an entrance face of the wavefront dividing element and being perpendicular to the optical axis $AX_e$.

19 Claims, 15 Drawing Sheets

(56) References Cited

U.S. PATENT DOCUMENTS

| | | | |
|---|---|---|---|
| 6,049,374 | A | 4/2000 | Komatsuda et al. |
| 6,583,855 | B2 | 6/2003 | Krikke et al. |
| 6,587,182 | B1 | 7/2003 | Goto |
| 6,754,246 | B2 | 6/2004 | Okada |
| 2002/0126479 | A1 | 9/2002 | Zhai et al. |
| 2004/0263977 | A1 | 12/2004 | Toyoda et al. |
| 2009/0002664 | A1* | 1/2009 | Tanitsu ............................ 355/67 |
| 2009/0316274 | A1* | 12/2009 | Lee et al. ....................... 359/634 |

FOREIGN PATENT DOCUMENTS

| | | |
|---|---|---|
| JP | A-63-197334 | 8/1988 |
| JP | A-6-302494 | 10/1994 |
| JP | A-7-94403 | 4/1995 |
| JP | A-9-127418 | 5/1997 |
| JP | A-10-319321 | 12/1998 |
| JP | A-2000-114163 | 4/2000 |
| JP | A-2000-150375 | 5/2000 |
| JP | A-2004-93868 | 3/2004 |
| JP | A-2004-198748 | 7/2004 |
| JP | A-2006-134932 | 5/2006 |
| WO | WO 2006/070580 A1 | 7/2006 |
| WO | WO 2007/072639 A1 | 6/2007 |
| WO | WO 2007/093396 A1 | 8/2007 |
| WO | WO 2007/093436 A1 | 8/2007 |

OTHER PUBLICATIONS

International Search Report for International Application No. PCT/JP2008/054399, issued Jun. 10, 2008.
International Preliminary Report on Patentability for International Application No. PCT/JP2008/054399, issued Sep. 22, 2009.
European Search Report issued in European Application No. 08721815.2 on Mar. 28, 2011.

* cited by examiner (a)

(b)

OPTICAL INTEGRATOR, ILLUMINATING OPTICAL DEVICE, EXPOSURE APPARATUS AND DEVICE MANUFACTURING METHOD

CROSS-REFERENCE TO RELATED APPLICATIONS

This is a continuation application of a PCT application No. PCT/JP20081054399 filed on Mar. 11, 2008, claiming the benefit of priorities from Japanese Patent application No. 2007-069234 filed on Mar. 16, 2007, and incorporated by reference in their entirety.

FIELD

The present invention relates to an optical integrator, an illumination optical apparatus, an exposure apparatus, and a device manufacturing method. More particularly, the present invention relates to an optical integrator suitably applicable to illumination optical apparatus in exposure apparatus for manufacturing devices (electronic devices and others) such as semiconductor devices, imaging devices, liquid crystal display devices, and thin-film magnetic heads by lithography.

DESCRIPTION OF THE RELATED ART

In an exposure apparatus, a light beam emitted from a light source is incident to a fly's eye lens as an optical integrator to fowl a secondary light source (a light intensity distribution formed on an illumination pupil) consisting of a large number of light sources on the rear focal plane of the fly's eye lens. Beams from the secondary light source travel through an aperture stop and a condenser lens to illuminate a mask with a predetermined pattern thereon in a superimposed manner. Light having passed through the pattern of the mask travels through a projection optical system to be focused on a wafer. In this manner, the mask pattern is projected (or transferred) onto the wafer to effect projection exposure thereof. Since the mask pattern is a highly integrated pattern, a uniform illuminance distribution must be made on the wafer, in order to accurately transfer this fine pattern onto the wafer.

In the exposure apparatus, the number of micro lens elements constituting the fly's eye lens needs to be set as large as possible, in order to enhance uniformity of the illuminance distribution. It is also necessary to form the secondary light source in a shape close to a desired shape, in order to avoid loss in light quantity at the aperture stop. A conceivable method for meeting the requirements is, for example, to set the size of the micro lens elements constituting the fly's eye lens, very small, i.e., to use a micro fly's eye lens. The micro fly's eye lens is made, for example, by forming a large number of micro refracting faces in a plane-parallel glass plate by applying the MEMS technology (lithography+etching, or the like).

The applicant of the present application has proposed a cylindrical micro fly's eye lens consisting of a pair of fly's eye members having cylindrical lens groups formed on their two side faces, for example, as an optical integrator capable of minimizing influence on the illuminance distribution from manufacturing errors in the large number of micro refracting faces integrally formed by etching (e.g., cf. Japanese Patent Application Laid-open No. 2004-198748).

In general, in the case of a conventional fly's eye lens wherein biconvex lens elements are arrayed vertically and horizontally and densely, surface shape errors in entrance faces and exit faces of the respective lens elements affect the illuminance distribution on an illumination target surface (a mask surface or a wafer surface in exposure apparatus). Especially, the surface shape errors in the exit faces affect the illuminance distribution on the illumination target surface more significantly than the surface shape errors in the entrance faces in an optically conjugate relation with the illumination target surface.

This is because a light-passing region in an exit face of each lens element varies with variation in an angle and angular range of light incident to the lens element, for example, due to movement of a movable optical member located upstream of the fly's eye lens. When there are surface shape errors in the exit faces of the lens elements, the light-passing regions in the exit faces will vary, so as to cause variation in the illuminance distribution formed on the illumination target surface and cause illumination nonuniformity eventually. In the case of the cylindrical micro fly's eye lens having a pair of optical faces with a refracting power acting in one direction in wavefront dividing elements, similarly, a surface shape error in the rear optical face out of the pair affects the illuminance distribution on the illumination target surface more significantly than a surface shape error in the front optical face.

When angles and angular ranges of light incident to the wavefront dividing elements of the optical integrator (lens elements in the case of the fly's eye lens) are fixed, a substantially uniform illuminance distribution can be obtained on the illumination target surface by using an illumination nonuniformity correction filter or the like. However, in the case where the angles and angular ranges of light incident to the wavefront dividing elements of the optical integrator vary, for example, due to movement of a movable optical member (which is a general concept embracing rotation and others), it becomes difficult to obtain a desired illuminance distribution on the illumination target surface.

In the case of a scanning exposure apparatus of the step-and-scan method, a certain degree of illuminance nonuniformity remaining in a scanning direction in a still exposure region will not raise any significant problem because of an averaging effect of scanning exposure. In contrast to it, illuminance nonuniformity in an orthogonal-to-scanning direction (direction orthogonal to the scanning direction) in the still exposure region is not subjected to the averaging effect of scanning exposure. As a consequence, when the conventional optical integrator is applied to the scanning exposure apparatus, it is difficult to obtain a desired illuminance distribution after scanning exposure and, in turn, it is difficult to achieve desired imaging performance. Therefore, there are desires for an optical integrator capable of minimizing occurrence of illuminance nonuniformity in the orthogonal-to-scanning direction in the still exposure region, for example, in application to the scanning exposure apparatus.

SUMMARY

An of the object of the present invention is to provide an optical integrator capable of minimizing occurrence of illuminance nonuniformity in a desired direction on an illumination target surface.

An object of another embodiment is to provide an illumination optical apparatus capable of illuminating an illumination target surface with a desired illuminance distribution, using the optical integrator which minimizes occurrence of illuminance nonuniformity in the desired direction on the illumination target surface.

An object of still another embodiment is to provide an exposure apparatus and a device manufacturing method capable of achieving good exposure under a good illumination condition, using the illumination optical apparatus for illuminating the illumination target surface with the desired illuminance distribution.

For the purpose of summarizing the present invention, the present specification includes the description of embodiments, effects, and novel features of the present invention. However, it should not be considered that all these effects are always achieved by any one of the embodiments of the present invention. Therefore, the present invention can be carried out by a method of implementing or optimizing one or more of the described effects, without always achieving all of the other effects described or proposed herein.

A first embodiment of the present invention provides an optical integrator comprising a plurality of wavefront dividing elements two-dimensionally arrayed,
wherein the wavefront dividing elements are so configured that a ray group obliquely incident to a center on an optical axis of an entrance face of each wavefront dividing element is emitted in parallel with the optical axis from the wavefront dividing element,
wherein each of the wavefront dividing elements includes at least one entrance-side optical face and at least one exit-side optical face, and
wherein in at least one wavefront dividing element out of the plurality of wavefront dividing elements, at least one curved optical face of the aforementioned wavefront dividing element is formed as inclined around an axis along a predetermined direction passing the optical-axis center of a predetermined entrance-side optical face of the wavefront dividing element and being perpendicular to the optical axis.

A second embodiment of the present invention provides an illumination optical apparatus for illuminating an illumination target surface on the basis of light from a light source, the illumination optical apparatus comprising the optical integrator of the first aspect arranged in an optical path between the light source and the illumination target surface.

A third embodiment of the present invention provides an exposure apparatus comprising the illumination optical apparatus of the second aspect for illuminating a predetermined pattern, which performs exposure of a photosensitive substrate with the predetermined pattern.

A fourth embodiment of the present invention provides a device manufacturing method comprising an exposure block of effecting the exposure of the photosensitive substrate with the predetermined pattern, using the exposure apparatus of the third embodiment; and a development block of developing the photosensitive substrate after the exposure block.

Since the curved optical face is formed as inclined in a required number of wavefront dividing elements in the optical integrator of the present invention, light passes through different regions in these tilt wavefront dividing elements from those in the ordinary wavefront dividing elements to which the technique of the present invention is not applied. As a consequence, the present embodiment allows light to pass through various regions with mutually different tendencies of surface shape errors in optical faces even with variation in the angle and angular range of light incident to each wavefront dividing element, for example, due to movement of a movable optical member located upstream of the optical integrator, whereby the present invention minimizes occurrence of illuminance nonuniformity in a desired direction on the illumination target surface because of the so-called averaging effect of surface shape errors.

Namely, the optical integrator of the embodiment of the present invention is able to minimize occurrence of illuminance nonuniformity in the desired direction on the illumination target surface and, for example, when it is applied to the scanning exposure apparatus, occurrence of illuminance nonuniformity can be minimized in the orthogonal-to-scanning direction in the still exposure region. Therefore, the illumination optical apparatus of the embodiment of the present invention is able to illuminate the illumination target surface with a desired illuminance distribution, using the optical integrator which minimizes occurrence of illuminance nonuniformity in the desired direction on the illumination target surface. The exposure apparatus of the embodiment of the present invention is able to perform good exposure under a good illumination condition, using the illumination optical apparatus which illuminates the illumination target surface with the desired illuminance distribution, and therefore to manufacture good devices.

It is considered that the present invention can be better understood in view of the following description and accompanying drawings. It is, however, noted that these description and accompanying drawings are presented for illustrating the present invention but not for limiting the present invention.

Further application examples of the present invention are considered to become clear in view of the detailed description provided below. It should be, however, understood that various changes and modifications within the scope of the present invention in view of the following detailed description are obvious to those skilled in the art and that the following detailed description and embodiments are presented as preferred examples of the present invention but by way of illustration only.

DESCRIPTION

Figure 1:
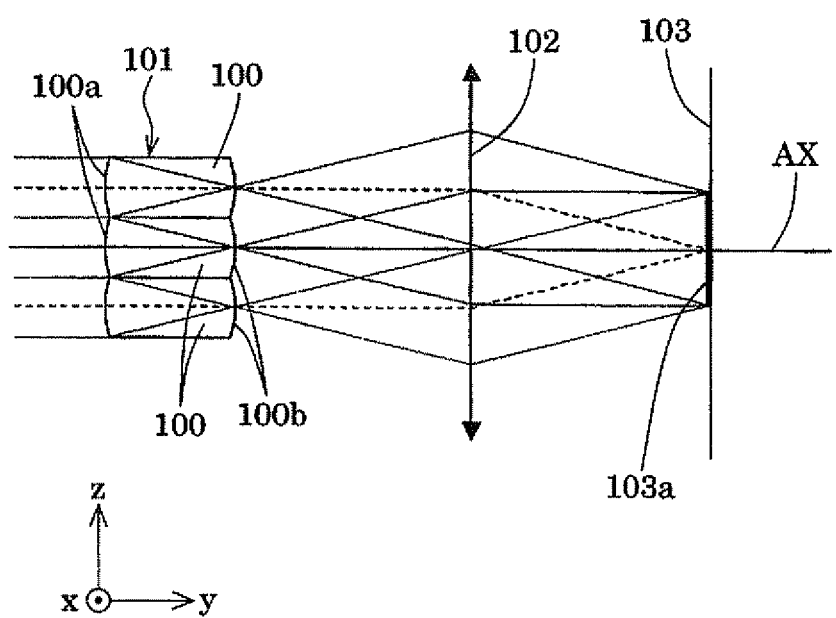
FIG. 1 is a drawing schematically showing a configuration of a fly's eye element wherein a plurality of biconvex lens elements are arrayed vertically and horizontally and densely.

Prior to specific description of embodiments of the present invention, description will be given as to a function of a fly's eye element (which is a general concept embracing a fly's eye lens, a micro fly's eye lens, a cylindrical micro fly's eye lens, and so on), and a basic idea of the embodiment of the present invention. For simplifying the description, the below will concern an example using a fly's eye lens 101 in a structure wherein a plurality of biconvex lens elements (wavefront dividing elements) 100 are arrayed vertically and horizontally and densely (or arranged in a two-dimensional array) as shown in FIG. 1, as the fly's eye element.

Figure 2:
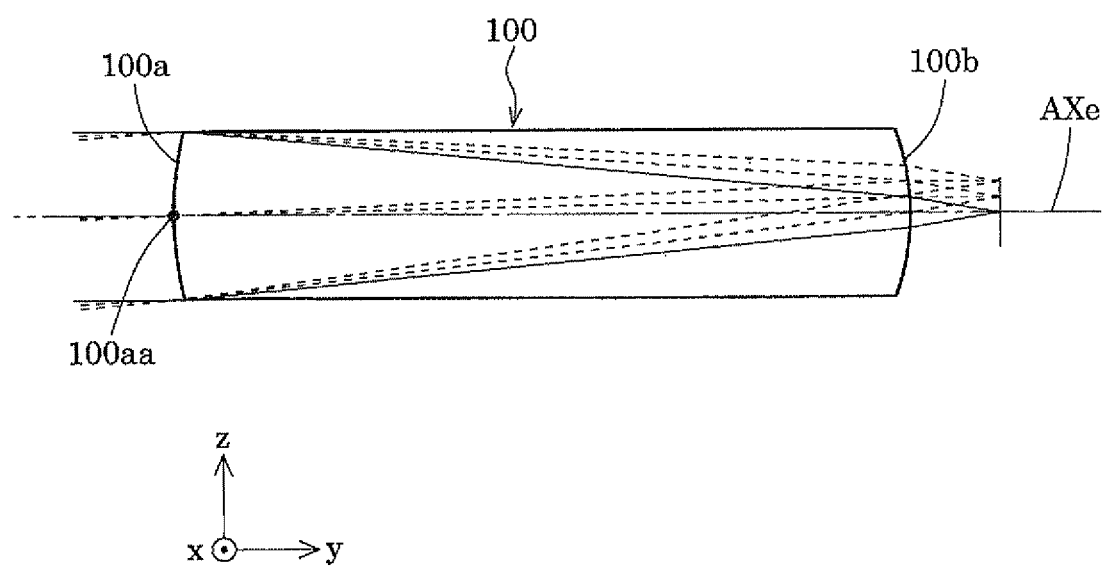
FIG. 2 is a drawing to illustrate a state in which a fly's eye element ensures the same exit NA for obliquely incident parallel light as that for normally incident parallel light.

The fly's eye element 101 arranged along the optical axis AX of an illumination optical apparatus functions to secure a required illumination region (illumination field) 103a on an illumination target surface 103 and achieve a uniform illuminance distribution in the illumination region 103a. For this purpose, a beam incident to an entrance face 100a of each lens element 100 forms a point light source near an exit face 100b and thereafter beams exiting from the respective lens elements travel through a condenser optical system 102 to illuminate the illumination region 103a on the illumination target surface 103 in a superimposed manner. At this time, as shown in FIG. 2, a parallel light beam (indicated by solid lines in FIG. 2) normally incident (or incident in a direction of the optical axis AXe of the lens element 100) to the entrance face 100a of the lens element 100 is emitted as a light beam with a predetermined exit NA from the exit face 100b and turns into a light beam with a required NA (numerical aperture or angular range) to reach the illumination region 103a eventually.

Figure 3:
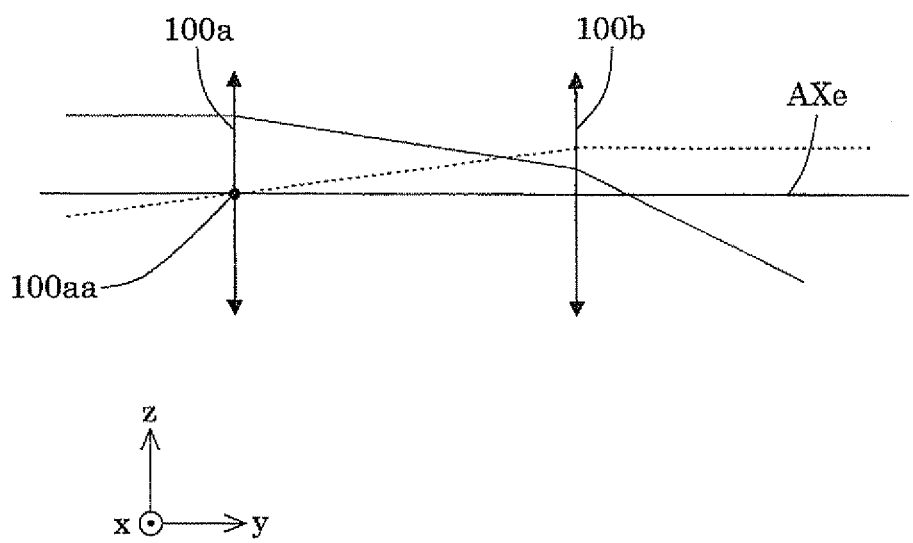
FIG. 3 is a drawing to illustrate a necessary condition for ensuring the same exit NA for obliquely incident parallel light and normally incident parallel light in a fly's eye element.

Furthermore, in the case of the fly's eye element 101, a parallel light beam (indicated by dashed lines in FIG. 2) obliquely incident (or incident in an oblique direction relative to the optical axis AXe) to the entrance face 100a of the lens element 100 is also emitted as a light beam which has the same exit NA as the normally incident parallel beam and a center angle (an angle of a principal ray in each lens element) of which is parallel to the optical axis, from the exit face 100b and turns into a light beam having the same NA as the normally incident parallel beam and the center angle parallel to the optical axis, to reach the illumination region 103a eventually. The condition for the obliquely incident parallel beam to ensure the same center angle as the normally incident parallel beam is implemented by satisfying the condition that a principal ray (indicated by a dashed line in FIG. 3) passing the optical-axis center (intersection between the entrance face 100a and the optical axis AXe) 100aa on the entrance face 100a is emitted as a ray parallel to the optical axis AXe from the exit face 100b, as shown in FIG. 3. In passing, this condition results in keeping the entrance face 100a in a conjugate relation with the illumination target surface.

As described above, the fly's eye element 101 is so configured that a ray group obliquely incident to the optical-axis center 100aa of the entrance face 100a of each lens element 100 being a wavefront dividing element is emitted in parallel with the optical axis AXe from the exit face 100b. The fly's eye element 101 is also so configured that a maximum exit angle (half angle; angle corresponding to exit NA) of light from the exit face 100b formed by light (parallel beam or the like) incident from the direction of the optical axis AXe to the entrance face 100a of each lens element 100 becomes equal to a maximum exit angle (half angle; angle corresponding to exit NA) of light from the exit face 100b formed by light (parallel beam or the like) incident from an oblique direction relative to the optical axis AXe to the entrance face 100a. Therefore, parallel beams incident at various angles to the fly's eye element 101 are emitted as beams each having the same NA and the center angle parallel to the optical axis, and thus they come to have exit angle characteristics completely independent of the angular range (NA) of incidence to the fly's eye element 101 and the center angle thereof.

In passing, for example, a microlens array except for the fly's eye element is so configured that ray groups obliquely incident to the optical-axis centers of entrance faces of wavefront dividing elements are emitted from the wavefront dividing elements so as to be not parallel but oblique relative to the optical axis. As a consequence, parallel beams incident at various angles to the microlens array of this kind are emitted with the same NA (angular range), but with their center angles (principal ray angles) being maintained; therefore, they eventually come to have exit angle characteristics dependent on the angular range (NA) of incidence to the microlens array and the center angle thereof, different from the fly's eye element 101.

As described previously, for example, when movement of a movable optical member located upstream of the fly's eye element 101 causes variation in the angle of light incident to the lens element 100 (angle of a centroidal ray or central ray of an incident beam to the optical axis AXe of the lens element 100) and in the angular range (maximum angle made by a ray group incident to a point on the entrance face 100a), there will also occur variation in a region where light passes in the exit face 100b of the lens element 100. When there is a surface shape error in the exit face 100b of lens element 100, it will change the region where light passes in the exit face 100b, so as to change an illuminance distribution formed in the illumination region 103a on the illumination target surface 103 and cause illumination nonuniformity eventually.

Figure 4:
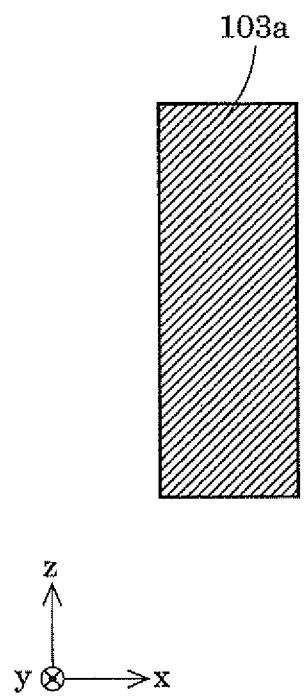
FIG. 4 is a drawing showing a rectangular illumination region formed on an illumination target surface by the fly's eye element shown in FIG. 1.

In fact, tendencies of surface shape errors in optical faces of the respective lens elements 100 are approximately identical with each other and tendencies of illuminance nonuniformity formed in the illumination region 103a by the respective lens elements 100 are also approximately identical with each other; therefore, the illuminance nonuniformity appears in both of the z-direction of the long-side direction and the x-direction of the short-side direction in the rectangular illumination region 103a shown in FIG. 4. As described previously, when this fly's eye element 101 is applied to an illumination optical system of a scanning exposure apparatus, a certain degree of illuminance nonuniformity remaining in the x-direction corresponding to the scanning direction does not cause any significant problem because of the averaging effect of scanning exposure. However, since the illuminance nonuniformity in the z-direction corresponding to the orthogonal-to-scanning direction is not subjected to the averaging effect of scanning exposure, it is difficult to obtain a desired illuminance distribution after scanning exposure with the illuminance nonuniformity remaining in the z-direction and, in turn, it is difficult to achieve desired imaging performance.

In order to minimize occurrence of illuminance nonuniformity in the z-direction in the illumination region 103a, it is conceivable to adopt a technique of setting a large angular range in the yz plane of light incident to each lens element 100 of the fly's eye element 101. Since this technique increases the region where light passes in the exit face 100b of each lens element 100, a fluctuation rate of the light-passing region can be kept relatively small even with variation in the light-passing region in the exit face 100b, for example, due to movement of the movable optical member, and, in turn, we can expect an effect of minimizing occurrence of illuminance nonuniformity in the z-direction. However, for setting the large angular range of light incident to each lens element 100, it is necessary to modify the configuration upstream the fly's eye element 101.

The embodiment of the present invention offers a technique of minimizing occurrence of illuminance nonuniformity in the z-direction (in general, illuminance nonuniformity in any desired direction) in the illumination region 103a on the illumination target surface 103, by modifying the configuration of the fly's eye element 101 itself or the configuration of the optical faces of the fly's eye element 101, without any change in the configuration upstream of the fly's eye element 101. In general, the technique of the present invention is as follows: in each of a required number of wavefront dividing elements (theoretically, at least one wavefront dividing element) out of a plurality of wavefront dividing elements constituting an optical integrator, at least one curved optical face of the wavefront dividing element is formed as inclined around an axis along a predetermined direction passing an optical-axis center of an entrance face of the wavefront dividing element and being perpendicular to the optical axis of the element.

Figure 5:
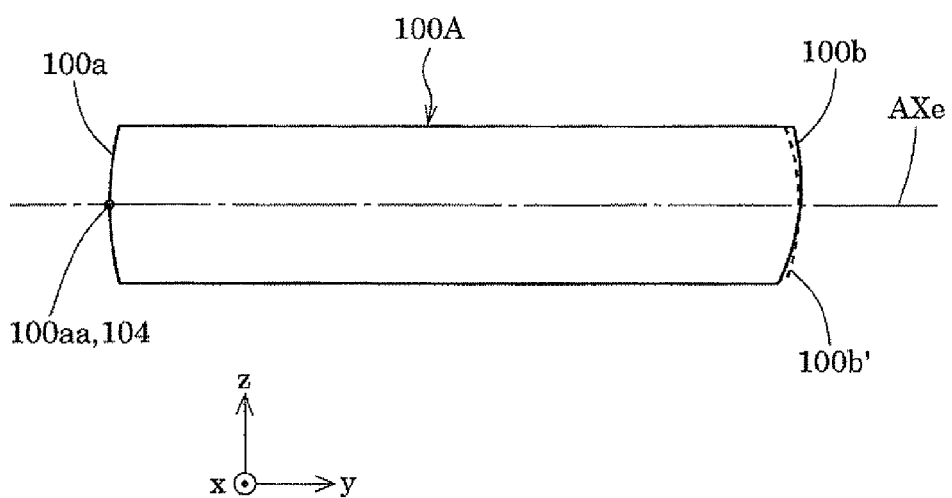
FIG. 5 is a drawing to illustrate application of the present invention to the fly's eye element shown in FIG. 1, wherein (a) is a view showing a state in which an exit refracting face of a lens element is formed as inclined, and (b) a view showing a state in which an entrance refracting face is formed as inclined.
Figure 5:
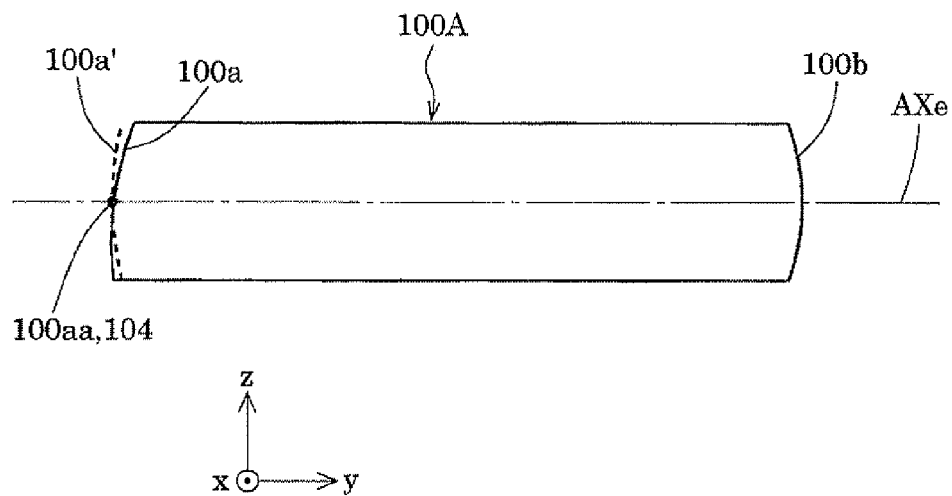

More specifically with reference to FIG. 5 (a), the technique of the present invention is configured in order to minimize occurrence of illuminance nonuniformity in the z-direction in the illumination region 103a so that in each of a required number of lens elements 100A out of a plurality of lens elements 100 constituting a fly's eye element 101, an exit refracting face 100b thereof is formed as inclined (or tilted) around an axis 104 along the x-direction passing an optical-axis center 100aa of an entrance face 100a and being perpendicular to the element optical axis AXe. A curve 100b' indicated by a dashed line in FIG. 5 (a) shows an exit refracting face of an ordinary lens element to which the technique of the present invention is not applied.

Another potential configuration for minimizing occurrence of illuminance nonuniformity in the z-direction in the illumination region 103a is such that in the tilt lens element 100A to which the technique of the present invention is applied, as shown in FIG. 5 (b), the entrance refracting face 100a thereof is formed as inclined around the axis 104 along the x-direction passing the optical-axis center 100aa and being perpendicular to the element optical axis AXe. A curve 100a' indicated by a dashed line in FIG. 5 (b) shows an entrance refracting face of an ordinary lens element to which the technique of the present invention is not applied. Another potential configuration for minimizing occurrence of illuminance nonuniformity in the z-direction in the illumination region 103a, which is not shown, is such that in the tilt lens element 100A, the entrance refracting face 100a and exit refracting face 100b thereof are formed as inclined around the axis 104 along the x-direction passing the optical-axis center 100aa and being perpendicular to the element optical axis AXe.

Since the optical integrator according to the present embodiment of has the required number of wavefront dividing elements wherein the curved optical face thereof is formed as inclined, light passes through regions in these tilt wavefront dividing elements different from those in the ordinary wavefront dividing elements to which the technique of the present embodiment is not applied. Since the required number of tilt wavefront dividing elements are formed so that light passes through the regions different from those in the ordinary wavefront dividing elements as described above, light passes through various regions with mutually different tendencies of surface shape errors of optical faces, whereby occurrence of illuminance nonuniformity in the desired direction on the illumination target surface can be minimized by the so-called averaging effect of surface shape errors. In other words, the present invention allows light to pass through various regions with mutually different tendencies of surface shape errors of optical faces, even with variation in angles and angular ranges of light incident to the respective wavefront dividing elements, for example, due to movement of a movable optical member located upstream the optical integrator, whereby the present invention achieves the same effect as in the case where the angular range of light incident to each wavefront dividing element is set large, i.e., the effect of minimizing occurrence of illuminance nonuniformity in the desired direction.

However, as described previously, it is important for the optical integrator like the fly's eye element 101 to satisfy the condition that beams incident to the entrance faces 100a of the respective lens elements 100 illuminate the illumination region 103a in a superimposed manner in order to ensure the required illumination region 103a on the illumination target surface 103, and the condition that the normally incident parallel light beams and obliquely incident parallel light beams to the entrance faces 100a of the lens elements 100 are emitted as light with the same exit NA from the exit faces 100b and turn into light with the same NA to reach the illumination region 103a eventually. In the present embodiment invention, for satisfying these conditions, it is important that the curved optical face of each tilt wavefront dividing element be formed as inclined around the axis along the predetermined direction passing the optical-axis center of the entrance face thereof and being perpendicular to the element optical axis.

Figure 6:
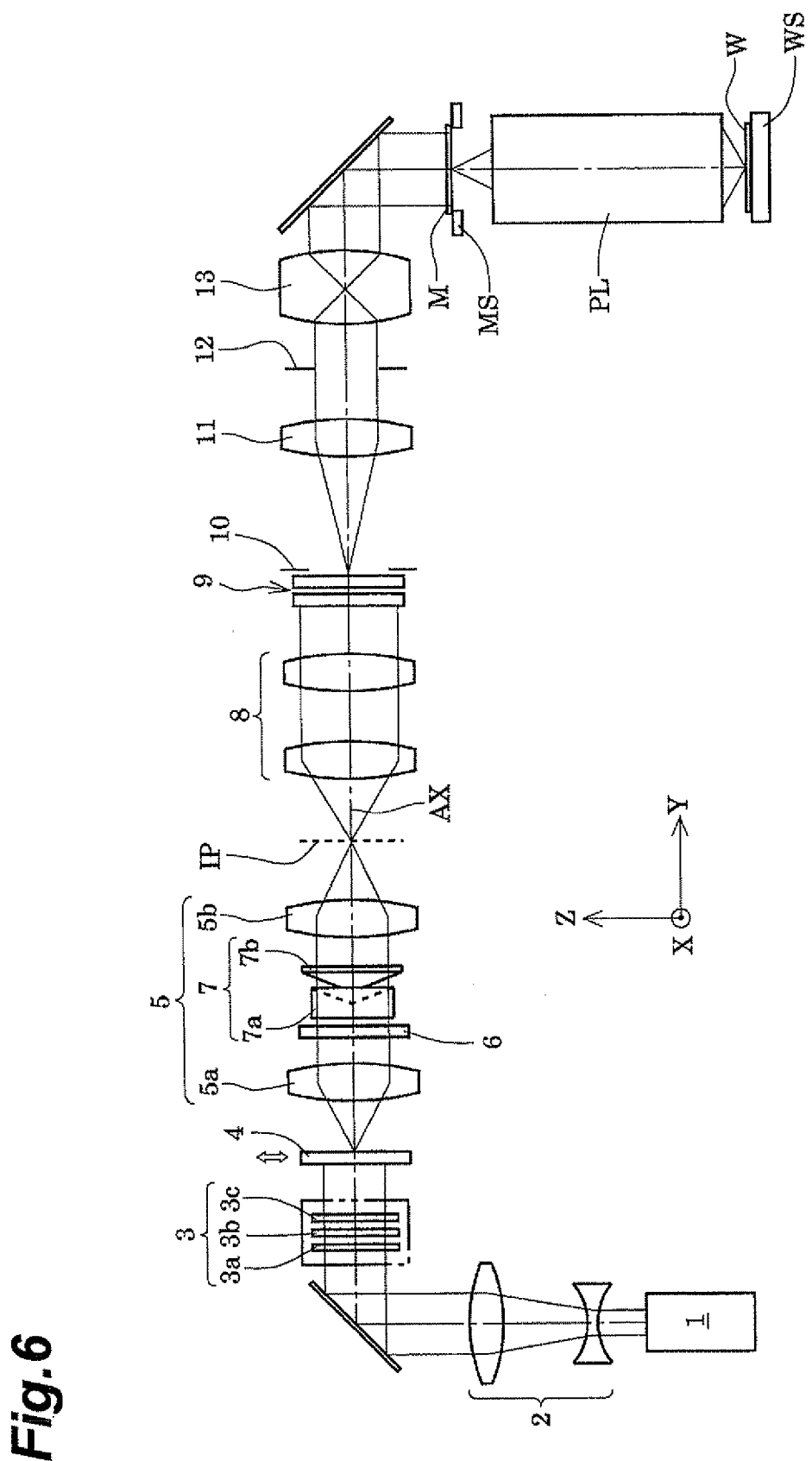
FIG. 6 is a drawing schematically showing a configuration of an exposure apparatus according to an embodiment of the present invention.

Embodiments of the present invention will be described below on the basis of the accompanying drawings. FIG. 6 is a drawing schematically showing a configuration of an exposure apparatus according to an embodiment of the present invention. In FIG. 6, the Z-axis is set along a direction of a normal to a wafer W being a photosensitive substrate, the Y-axis along a direction parallel to the plane of FIG. 6 in the surface of the wafer W, and the X-axis along a direction normal to the plane of FIG. 6 in the surface of the wafer W. With reference to FIG. 6, the exposure apparatus of the present embodiment is provided with a light source 1 for supplying exposure light (illumination light). The light source 1 can be, for example, an ArF excimer laser light source for supplying light at the wavelength of 193 nm, a KrF excimer laser light source for supplying light at the wavelength of 248 nm, or the like.

The light emitted from the light source 1 is expanded into a beam of a required sectional shape by a shaping optical system 2 and the expanded beam travels through a polarization state switch 3 and a diffractive optical element 4 for annular illumination to enter an afocal lens 5. The polarization state switch 3 is composed of a quarter wave plate 3a the crystal optic axis of which is arranged to be rotatable about the optical axis AX and which converts elliptically polarized light incident thereto, into linearly polarized light, a half wave plate 3b the crystal optic axis of which is arranged to be rotatable about the optical axis AX and which changes a direction of polarization of incident linearly polarized light, and a depolarizer (depolarizing element) 3c arranged as retractable from the illumination optical path.

In a state in which the depolarizer 3c is retracted from the illumination optical path, the polarization state switch 3 has a function to convert the light from the light source 1 into linearly polarized light having a desired polarization direction and guide the linearly polarized light into the diffractive optical element 4; in a state in which the depolarizer 3c is set in the illumination optical path, the polarization state switch 3 has a function to convert the light from the light source 1 into substantially unpolarized light and guide the unpolarized light into the diffractive optical element 4. The afocal lens 5 is an afocal system (afocal optical system) the front focal position of which agrees substantially with the position of the diffractive optical element 4 and the rear focal position of which agrees substantially with a position of a predetermined plane IP indicated by a dashed line in the drawing.

The diffractive optical element 4 is made by forming level differences at the pitch approximately equal to the wavelength of the exposure light (illumination light) in a substrate, and has the action to diffract an incident beam to desired angles. Specifically, the diffractive optical element 4 for annular illumination has the following function: when a parallel beam with a rectangular cross section is incident thereto, it forms an annular light intensity distribution in its far field (or Fraunhofer diffraction region). Therefore, a nearly parallel beam incident to the diffractive optical element 4 forms an annular light intensity distribution on the pupil plane of the afocal lens 5 and is then emitted in an annular angle distribution from the afocal lens 5.

A polarization converting element 6 and a conical axicon system 7 are arranged in the optical path between a front lens unit 5a and a rear lens unit 5b of the afocal lens 5 and at or near the pupil position thereof. The configurations and actions of the polarization converting element 6 and the conical axicon system 7 will be described later. The beam having passed through the afocal lens 5 travels through a zoom lens 8 for varying the σ value (σ value=mask-side numerical aperture of the illumination optical apparatus/mask-side numerical aperture of the projection optical system), to enter a cylindrical micro fly's eye lens 9 as an optical integrator.

Figure 7:
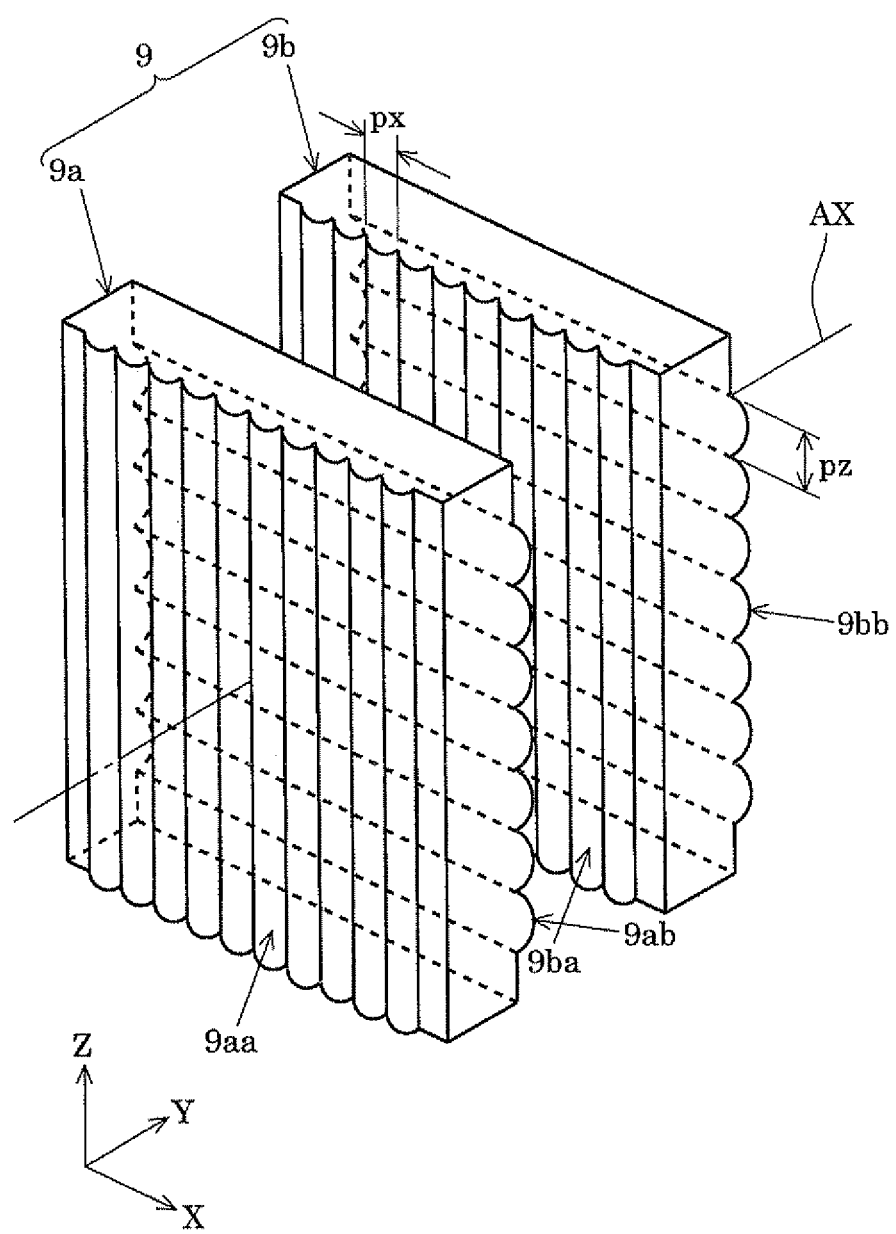
FIG. 7 is a perspective view schematically showing a configuration of a cylindrical micro fly's eye lens shown in FIG. 6.

The cylindrical micro fly's eye lens 9, as shown in FIG. 7, is composed of a first fly's eye member 9a located on the light source side and a second fly's eye member 9b located on the mask side. Cylindrical lens groups (entrance refracting faces of a cylindrical surface shape) 9aa and 9ba arrayed in juxtaposition along the X-direction are formed each at the pitch px in the light-source-side surface of the first fly's eye member 9a and in the light-source-side surface of the second fly's eye member 9b, respectively. Cylindrical lens groups (exit refracting faces of a cylindrical surface shape) 9ab and 9bb arrayed in juxtaposition along the Z-direction are formed each at the pitch pz (pz>px) in the mask-side surface of the first fly's eye member 9a and in the mask-side surface of the second fly's eye member 9b, respectively.

When attention is focused on the refracting action in the X-direction (or the refracting action in the XY plane) of the cylindrical micro fly's eye lens 9, a parallel beam incident along the optical axis AX is subjected to wavefront division at the pitch px along the X-direction by the cylindrical lens group 9aa formed on the light source side of the first fly's eye member 9a, and the divided beams are condensed by the refracting faces thereof, and thereafter condensed by the refracting faces of the corresponding cylindrical lenses in the cylindrical lens group 9ba formed on the light source side of the second fly's eye member 9b, to be converged on the rear focal plane of the cylindrical micro fly's eye lens 9.

When attention is focused on the refracting action in the Z-direction (or the refracting action in the YZ plane) of the cylindrical micro fly's eye lens 9, a parallel beam incident along the optical axis AX is subjected to wavefront division at the pitch pz along the Z-direction by the cylindrical lens group 9ab formed on the mask side of the first fly's eye member 9a, and the divided beams are condensed by the refracting faces thereof, and thereafter condensed by the refracting faces of the corresponding cylindrical lenses in the cylindrical lens group 9bb formed on the mask side of the second fly's eye member 9b, to be converged on the rear focal plane of the cylindrical micro fly's eye lens 9.

As described above, the cylindrical micro fly's eye lens 9 is composed of the first fly's eye member 9a and the second fly's eye member 9b in each of which the cylindrical lens groups are arranged in the two side faces, and exercises the same optical function as a micro fly's eye lens in which a large number of rectangular micro refracting faces (wavefront dividing elements) having the size of px in the X-direction and the size of pz in the Z-direction are integrally formed vertically and horizontally and densely. The cylindrical micro fly's eye lens 9 is able to minimize change in distortion due to variation in the surface shape of the micro refracting faces and to minimize the influence on the illuminance distribution from manufacturing errors in the large number of micro refracting faces integrally formed, for example, by etching.

The position of the predetermined plane IP is located at or near the front focal position of the zoom lens 8 and the entrance surface of the cylindrical micro fly's eye lens 9 is located at or near the rear focal position of the zoom lens 8. In other words, the zoom lens 8 acts to keep the predetermined plane IP and the entrance surface of the cylindrical micro fly's eye lens 9 substantially in the relation of Fourier transform and, in turn, to keep the pupil plane of the afocal lens 5 and the entrance surface of the cylindrical micro fly's eye lens 9 optically substantially conjugate with each other.

Therefore, for example, an annular illumination field centered on the optical axis AX is formed on the entrance surface of the cylindrical micro fly's eye lens 9 as on the pupil plane of the afocal lens 5. The overall shape of this annular illumination field similarly varies depending upon the focal length of the zoom lens 8. A rectangular micro refracting face as a wavefront dividing unit element in the cylindrical micro fly's eye lens 9 is of a rectangular shape similar to a shape of an illumination field to be formed on a mask M (and, in turn, similar to a shape of an exposure region to be formed on a wafer W).

The beam incident to the cylindrical micro fly's eye lens 9 is two-dimensionally divided to than a secondary light source with a light intensity distribution approximately identical with the illumination field formed by the incident beam, i.e., a secondary light source consisting of a substantial surface illuminant of an annular shape centered on the optical axis AX, on or near the rear focal plane of the cylindrical micro fly's eye lens 9 (and on the illumination pupil virtually). Beams from the secondary light source formed on or near the rear focal plane of the cylindrical micro fly's eye lens 9 are incident to an aperture stop 10 located near it.

The aperture stop 10 has an aperture (light transmitting portion) of an annular shape corresponding to the secondary light source of the annular shape formed on or near the rear focal plane of the cylindrical micro fly's eye lens 9. The aperture stop 10 is arranged as retractable from the illumination optical path and is arranged as replaceable with a plurality of aperture stops having respective apertures of different sizes and shapes. A method of switching the aperture stops can be selected, for example, from the well-known turret method and slide method, and others. The aperture stop 10 is located at a position optically approximately conjugate with the entrance pupil plane of the projection optical system PL described later, and defines a range of contribution to illumination of the secondary light source. The installation of the aperture stop 10 can be omitted.

The light from the secondary light source limited by the aperture stop 10 travels through a condenser optical system 11 to illuminate a mask blind 12 in a superimposed manner. In this manner, an illumination field of a rectangular shape according to the shape and focal length of the rectangular micro refracting faces being the wavefront dividing elements of the cylindrical micro fly's eye lens 9 is formed on the mask blind 12 as an illumination field stop. The light having passed through a rectangular aperture (light transmitting portion) of the mask blind 12 is converged by an imaging optical system 13 and thereafter illuminates the mask M with a predetermined pattern thereon, in a superimposed manner. Namely, the imaging optical system 13 forms an image of the rectangular aperture of the mask blind 12 on the mask M.

The pattern to be transferred is formed on the mask M held on a mask stage MS and the mask is illuminated in a pattern region of a rectangular shape (slit shape) having the long sides along the Y-direction and the short sides along the X-direction in the entire pattern region. The light having passed through the pattern region of the mask M travels through the projection optical system PL to form an image of the mask pattern on the wafer (photosensitive substrate) W held on a wafer stage WS. Namely, the pattern image is formed in a still exposure region (effective exposure region) of a rectangular shape having the long sides along the Y-direction and the short sides along the X-direction on the wafer W as well, so as to optically correspond to the rectangular illumination region on the mask M.

In this configuration, the mask stage MS and the wafer stage WS and, therefore, the mask M and the wafer W are synchronously moved (scanned) along the X-direction (scanning direction) in the plane (XY plane) perpendicular to the optical axis AX of the projection optical system PL in accordance with the so-called step-and-scan method, whereby a shot area (exposure region) having a width equal to the Y-directional length of the still exposure region and a length according to a scanning distance (moving distance) of the wafer W, is scanned and exposed with the mask pattern on the wafer W.

A diffractive optical element for multi-pole illumination (dipole illumination, quadrupole illumination, octupole illumination, or the like) (not shown) can be set instead of the diffractive optical element 4 for annular illumination in the illumination optical path, thereby to implement multi-pole illumination. When a parallel beam with a rectangular cross section is incident to the diffractive optical element for multi-pole illumination, the diffractive optical element for multi-pole illumination functions to form a light intensity distribution of a multi-pole shape (dipole, quadrupole, octupole, or other shape) in its far field. Therefore, light having passed through the diffractive optical element for multi-pole illumination forms an illumination field of a multi-pole shape, for example, consisting of a plurality of circular illumination fields around the optical axis AX, on the entrance surface of the cylindrical micro fly's eye lens 9. As a result, the secondary light source of the same multi-pole shape as the illumination field formed on the entrance surface is also formed on or near the rear focal plane of the cylindrical micro fly's eye lens 9.

When a diffractive optical element for circular illumination (not shown) is set instead of the diffractive optical element 4 for annular illumination in the illumination optical path, it can implement normal circular illumination. When a parallel beam with a rectangular cross section is incident to the diffractive optical element for circular illumination, the diffractive optical element for circular illumination functions to form a light intensity distribution of a circular shape in the far field. Therefore, a light beam having passed through the diffractive optical element for circular illumination forms, for example, an illumination field of a circular shape centered on the optical axis AX, on the entrance surface of the cylindrical micro fly's eye lens 9. As a result, the secondary light source of the same circular shape as the illumination field formed on the entrance surface is also formed on or near the rear focal plane of the cylindrical micro fly's eye lens 9. When a diffractive optical element with an appropriate characteristic (not shown) is set instead of the diffractive optical element 4 for annular illumination in the illumination optical path, it becomes feasible to implement one of various forms of modified illuminations. A method of replacing the diffractive optical element 4 with another can be selected, for example, from the well-known turret method and slide method, and others.

The conical axicon system 7 is composed of a first prism member 7a with a plane on the light source side and a refracting face of a concave conical shape on the mask side, and a second prism member 7b with a plane on the mask side and a refracting face of a convex conical shape on the light source side, which are arranged in order from the light source side. The concave conical refracting surface of the first prism member 7a and the convex conical refracting surface of the second prism member 7b are complementarily formed so as to contact each other. At least one of the first prism member 7a and the second prism member 7b is arranged as movable along the optical axis AX so as to vary the spacing between the concave conical refracting surface of the first prism member 7a and the convex conical refracting surface of the second prism member 7b. The action of the conical axicon system 7 and the action of the zoom lens 8 will be described below with focus on the annular or quadrupolar secondary light source.

In a state in which the concave conical refracting surface of the first prism member 7a and the convex conical refracting surface of the second prism member 7b contact each other, the conical axicon system 7 functions as a plane-parallel plate and causes no effect on the annular or quadrupolar secondary light source formed. As the concave conical refracting surface of the first prism member 7a and the convex conical refracting surface of the second prism member 7b are moved away from each other, the outside diameter (inside diameter) of the annular or quadrupolar secondary light source varies while the width of the annular or quadrupolar secondary light source (half of the difference between the outside diameter and the inside diameter of the annular secondary light source; or half of the difference between the diameter (outside diameter) of a circle circumscribed to the quadrupolar secondary light source and the diameter (inside diameter) of a circle inscribed in the quadrupolar secondary light source) is kept constant. Namely, the separation results in change in the annular ratio (inside diameter/outside diameter) and the size (outside diameter) of the annular or quadrupolar secondary light source.

The zoom lens 8 has a function to similarly enlarge or reduce the overall shape of the annular or quadrupolar secondary light source. For example, when the focal length of the zoom lens 8 is increased from a minimum to a predetermined value, the overall shape of the annular or quadrupolar secondary light source is similarly enlarged. In other words, the action of the zoom lens 8 is to vary both the width and the size (outside diameter) of the annular or quadrupolar secondary light source, without change in the annular ratio thereof. In this manner, the annular ratio and size (outside diameter) of the annular or quadrupolar secondary light source can be controlled by the actions of the conical axicon system 7 and the zoom lens 8.

Figure 8:
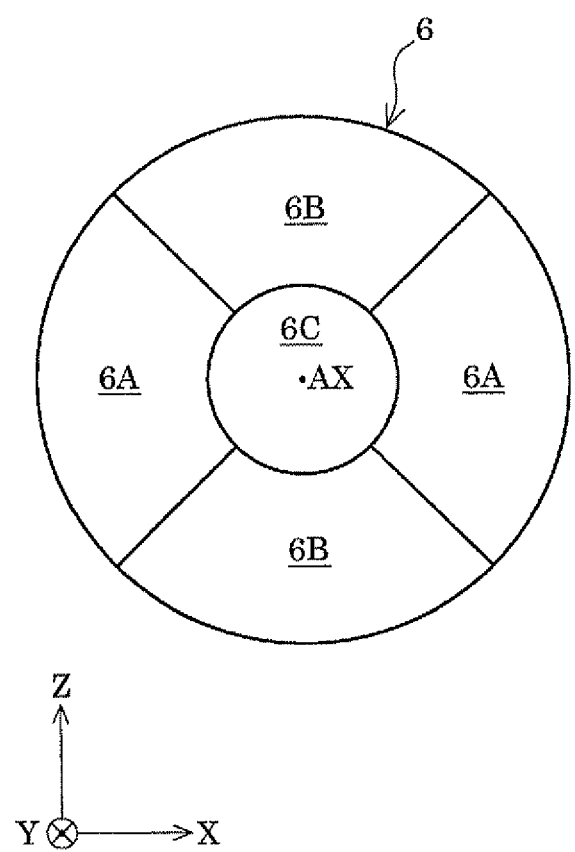
FIG. 8 is a drawing schematically showing a configuration of a polarization converting element shown in FIG. 6.

The polarization converting element 6 is arranged at or near the pupil position of the afocal lens 5, i.e., on or near the pupil plane of the illumination optical system (2-13). In the case of the annular illumination, therefore, a beam with an approximately annular cross section centered on the optical axis AX is incident to the polarization converting element 6. The polarization converting element 6, as shown in FIG. 8, has an effective region of an annular shape centered on the optical axis AX as a whole and this annular effective region is composed of four elementary elements of a fan shape around the optical axis AX obtained by equally dividing the effective region in the circumferential direction. Among these four elementary elements, a pair of elementary elements opposed on both sides of the optical axis AX have the same characteristics.

Namely, the four elementary elements consist of two types of elementary elements 6A and 6B two each with mutually different thicknesses (lengths in the optical-axis direction) along the light transmitting direction (Y-direction). Specifically, the thickness of the first elementary elements 6A is set larger than the thickness of the second elementary elements 6B. As a result, one surface (e.g., the entrance surface) of the polarization converting element 6 is planar, while the other surface (e.g., the exit surface) is uneven because of the difference between the thicknesses of the elementary elements 6A, 6B. Each of the elementary elements 6A, 6B is made of rock crystal being an optical material with optical rotatory power and its crystal optic axis is set to be aligned approximately with the optical axis AX.

Figure 9:
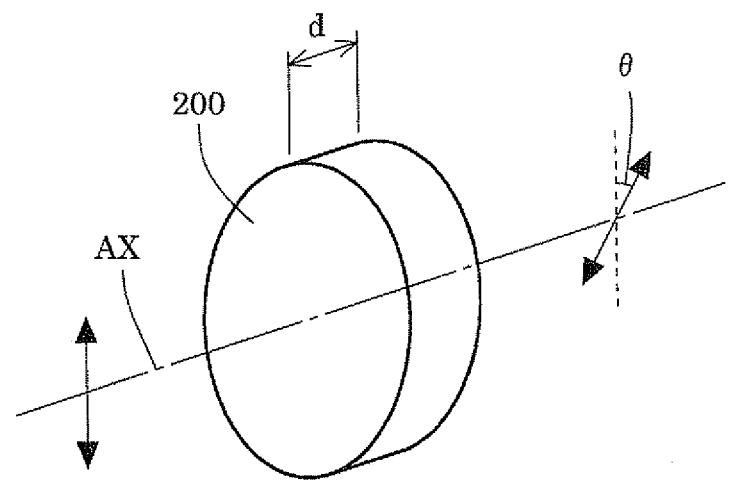
FIG. 9 is a drawing to illustrate the optical rotatory power of rock crystal.

The optical rotatory power of rock crystal will be briefly described below with reference to FIG. 9. Referring to FIG. 9, an optical member 200 of a plane-parallel plate shape made of rock crystal in the thickness d is arranged so that its crystal optic axis is aligned with the optical axis AX. In this case, linearly polarized light incident into the optical member 200 is emitted in a state in which its polarization direction is rotated by θ about the optical axis AX by virtue of the optical rotatory power thereof. At this time, the angle of rotation (optical rotatory angle) θ of the polarization direction due to the optical rotatory power of the optical member 200 is represented by Eq (a) below, using the thickness d of the optical member 200 and the optical rotatory power ρ of rock crystal.

$$\theta = d \cdot \rho \quad (a)$$

In general, the optical rotatory power ρ of rock crystal has wavelength dependence (a property of varying the value of optical rotatory power dependent on the wavelength of used light: optically rotating dispersion) and, specifically, it tends to increase with decrease in the wavelength of used light. According to the description on p 167 in "Oyou Kougaku (Applied Optics) II," the optical rotatory power ρ of rock crystal for light with the wavelength of 250.3 nm is 153.9°/mm.

The first elementary elements 6A have the thickness dA defined as follows: when linearly polarized light with the polarization direction along the Z-direction is incident thereto, they emit linearly polarized light with the polarization direction along a direction resulting from +180° rotation of the Z-direction around the Y-axis, i.e., along the Z-direction. In this case, therefore, the Z-direction is the polarization direction of beams passing through a pair of arcuate regions 31A formed by beams optically rotated by the pair of first elementary elements 6A, in the annular secondary light source 31 shown in FIG. 10.

The second elementary elements 6B have the thickness dB defined as follows: when linearly polarized light with the polarization direction along the Z-direction is incident thereto, they emit linearly polarized light with the polarization direction along a direction resulting from +90° rotation of the Z-direction around the Y-axis, i.e., along the X-direction. In this case, therefore, the X-direction is the polarization direction of beams passing through a pair of arcuate regions 31B formed by beams optically rotated by the pair of second elementary elements 6B, in the annular secondary light source 31 shown in FIG. 10.

The polarization converting element 6 can also be obtained by combining the four elementary elements separately made, or the polarization converting element 6 can also be obtained by forming the required uneven shape (level differences) in a rock crystal substrate of a plane-parallel plate shape. In general, various modification examples can be contemplated as to the number, shape, optical properties, etc. of the elementary elements constituting the polarization converting element 6. In order to enable implementation of normal circular illumination without retracting the polarization converting element 6 from the optical path, the polarization converting element 6 is provided with a circular central region 6C having the size not less than one third of the radial size of the effective region of the polarization converting element 6 and having no optical rotatory power. The central region 6C herein may be made, for example, of an optical material without optical rotatory power like silica, or may be simply a circular aperture.

Figure 10:
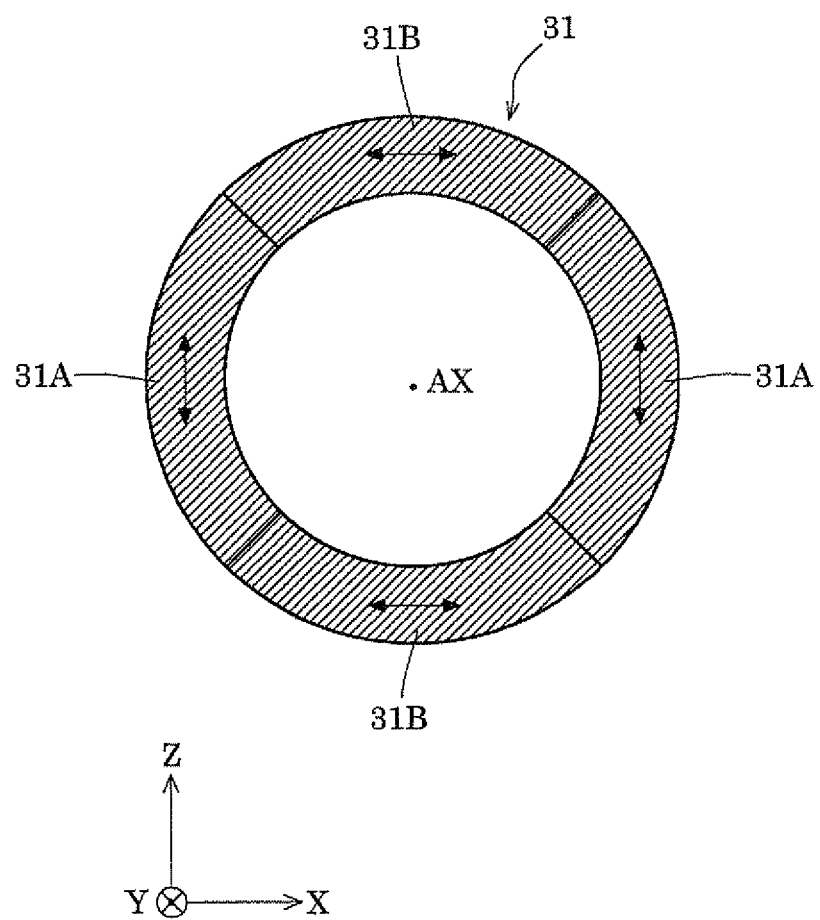
FIG. 10 is a drawing schematically showing a secondary light source of an annular shape set in a circumferentially polarized state by action of the polarization converting element.

In the present embodiment, circumferential polarization (azimuthal polarization) annular illumination (modified illumination in which light passing through the annular secondary light source is set in a circumferentially polarized state) is implemented in such a manner that the angular position of the crystal optic axis of the half wave plate 3b in the polarization state switch 3 is adjusted about the optical axis to make light of Z-directional polarization (linearly polarized light with the polarization direction along the Z-direction) incident to the diffractive optical element 4 for annular illumination whereby the Z-directionally polarized light is made incident to the polarization converting element 6. As a result, the annular secondary light source (annular illumination pupil distribution) 31 is formed on or near the rear focal plane of the cylindrical micro fly's eye lens 9, as shown in FIG. 10, and the light passing through the annular secondary light source 31 is set in the circumferentially polarized state.

In the circumferentially polarized state, beams passing through the respective arcuate regions 31A, 31B constituting the annular secondary light source 31 are changed into a linearly polarized state with the polarization direction aligned approximately with a tangent direction to a circle centered on the optical axis AX, at the center position along the circumferential direction of each arcuate region 31A, 31B. In the circumferential polarization (azimuthal polarization) annular illumination based on the annular illumination pupil distribution in the circumferentially polarized state, the light impinging upon the wafer W as a final illumination target surface is in a polarized state in which the principal component is S-polarized light. Here the S-polarized light is linearly polarized light with the polarization direction along a direction normal to the plane of incidence (or polarized light whose electric vector is vibrating in directions normal to the plane of incidence). The plane of incidence is defined as a plane including a normal to a boundary surface of a medium (illumination target surface: a surface of wafer W) at a point where light reaches the boundary surface, and a direction of incidence of the light.

As a result, the circumferential polarization (azimuthal polarization) annular illumination achieves an improvement in the optical performance (the depth of focus and others) of the projection optical system and provides a good mask pattern image with high contrast on the wafer (photosensitive substrate). In general, not only in the case of the annular illumination, but also, for example, in the case of illumination based on a multi-pole illumination pupil distribution in the circumferentially polarized state, the light incident to the wafer W is in the polarized state in which the principal component is the S-polarized light, and a good mask pattern image with high contrast is obtained on the wafer W. In this case, a diffractive optical element for multi-pole illumination (dipole illumination, quadrupole illumination, octupole illumination, or the like) is set instead of the diffractive optical element 4 for annular illumination in the illumination optical path and the angular position of the crystal optic axis of the half wave plate 3b in the polarization state switch 3 is adjusted around the optical axis to make Z-directionally polarized light incident to the diffractive optical element for multi-pole illumination, whereby the Z-directionally polarized light is made incident to the polarization converting element 6.

Figure 11:
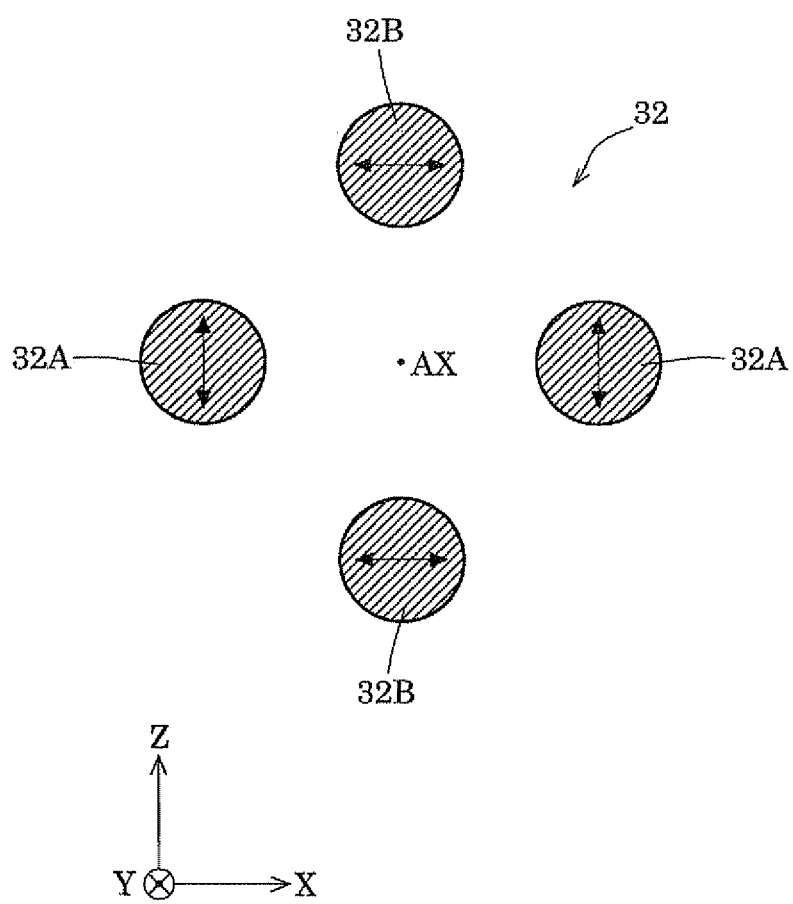
FIG. 11 is a drawing schematically showing a secondary light source of a quadrupolar shape set in a circumferentially polarized state by action of the polarization converting element.

Specifically, for example, in the case of circumferentially polarized quadrupole illumination (modified illumination in which beams passing through the quadrupolar secondary light source are set in the circumferentially polarized state), the angular position of the crystal optic axis of the half wave plate 3b in the polarization state switch 3 is adjusted around the optical axis to make the Z-directionally polarized light incident to the diffractive optical element for quadrupole illumination whereby the Z-directionally polarized light is made incident to the polarization converting element 6. As a result, the quadrupolar secondary light source (quadrupolar illumination pupil distribution) 32 is formed, as shown in FIG. 11, on or near the rear focal plane of the cylindrical micro fly's eye lens 9 and beams passing through the quadrupolar secondary light source 32 are set in the circumferentially polarized state. In the circumferentially polarized quadrupole illumination, beams passing through respective circular regions 32A, 32B constituting the quadrupolar secondary light source 32 are changed into a linearly polarized state with the polarization direction aligned approximately with a tangent direction to a circle centered on the optical axis AX, at a center position along the circumferential direction of each circular region 32A, 32B.

In the exposure apparatus of the present embodiment, the movable optical members arranged as movable in the optical path like the movable prism member in the conical axicon system 7 and the movable lens in the zoom lens 8 are arranged upstream the cylindrical micro fly's eye lens 9. Movement of these movable optical members will result in variation in the angle and angular range of light incident to each wavefront dividing element of the cylindrical micro fly's eye lens 9 and it will become difficult to obtain a desired illuminance distribution in the rectangular still exposure region formed on the wafer W being an illumination target surface.

Figure 12:
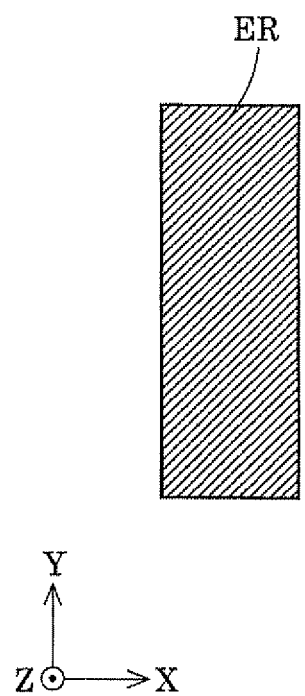
FIG. 12 is a drawing showing a rectangular still exposure region formed on a wafer surface in an embodiment of the present invention.

Namely, illuminance nonuniformity occurs in both of the Y-direction of the long-side direction and the X-direction of the short-side direction in the rectangular still exposure region ER shown in FIG. 12. In the case of the scanning exposure apparatus as in the present embodiment, as described previously, a certain degree of illuminance nonuniformity remaining in the X-direction being the scanning direction will not cause any significant problem because of the averaging effect of scanning exposure. However, when illuminance nonuniformity remains in the Y-direction being the orthogonal-to-scanning direction, it is difficult to obtain a desired illuminance distribution after the scanning exposure and, in turn, it is difficult to achieve desired imaging performance. In the present embodiment, it is required to minimize occurrence of illuminance nonuniformity, particularly, in the Y-direction (corresponding to the Z-direction at the position of the cylindrical micro fly's eye lens 9) in the still exposure region ER as an illumination region formed on the wafer W.

Figure 13:
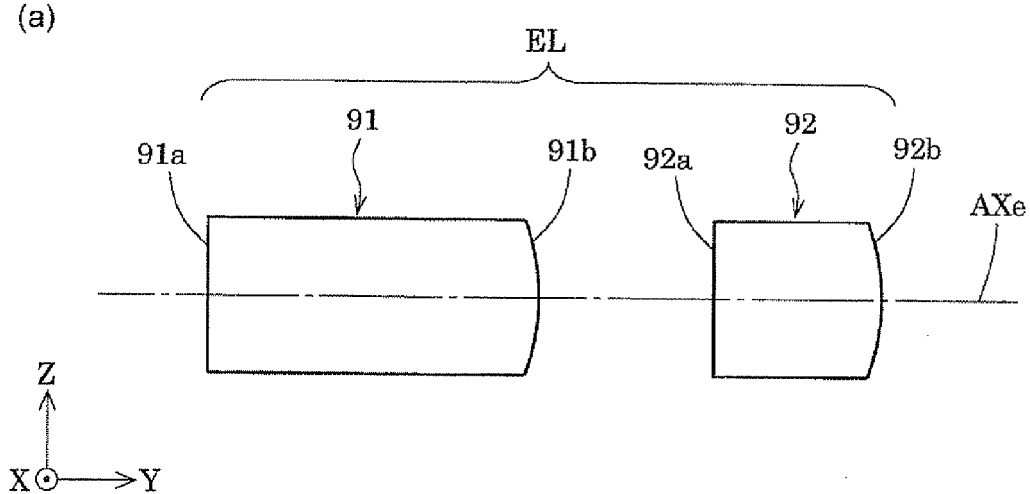
FIG. 13 is a drawing to illustrate application of the present invention to the cylindrical micro fly's eye lens shown in FIG. 6, wherein (a) is a view showing a configuration of an ordinary wavefront dividing element, (b) a view showing a state in which an exit refracting face of a first wavefront dividing element is formed as inclined, and (c) a view showing a state in which an exit refracting face of a second wavefront dividing element is formed as inclined.
Figure 13:
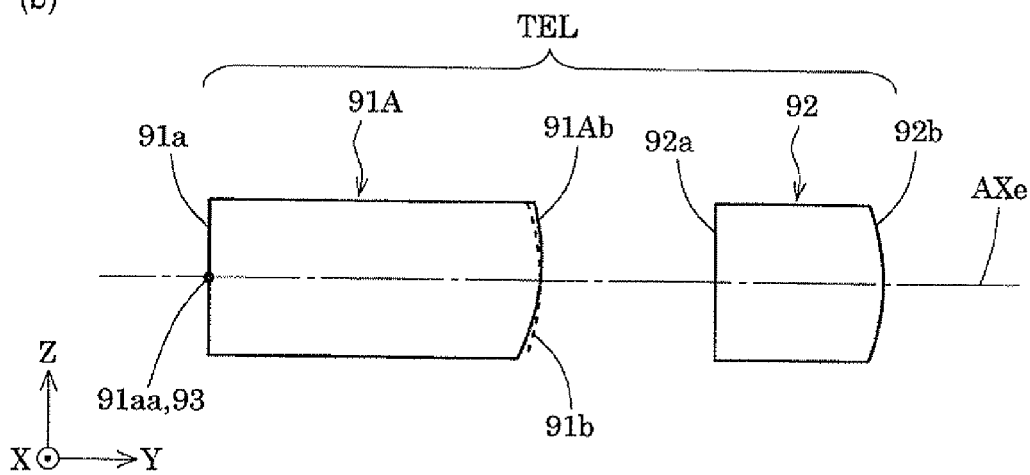
Figure 13:
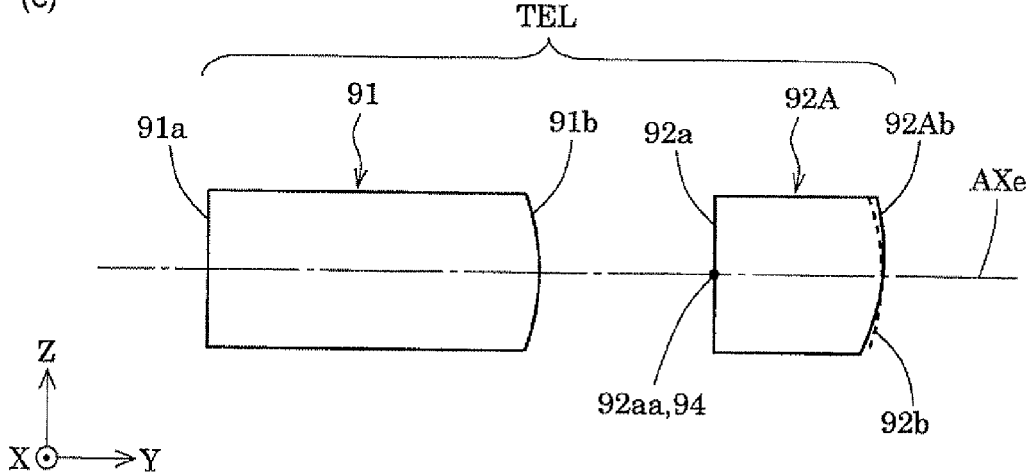

In the present embodiment, in order to minimize the occurrence of illuminance nonuniformity in the Y-direction in the still exposure region ER, the present embodiments applied to the cylindrical micro fly's eye lens 9. The cylindrical micro fly's eye lens 9 has a plurality of wavefront dividing elements two-dimensionally arrayed along the XZ plane. As shown in FIG. 13 (a), each wavefront dividing element EL has a first wavefront dividing element 91 and a second wavefront dividing element 92 in order from the light entrance side. The first fly's eye member 9a of the cylindrical micro fly's eye lens 9 is composed of a plurality of first wavefront dividing elements 91 two-dimensionally arrayed along the XZ plane, and the second fly's eye member 9b is composed of a plurality of second wavefront dividing elements 92 two-dimensionally arrayed along the XZ plane.

The first fly's eye member 9a has a plurality of entrance refracting faces 9aa of a cylindrical surface shape formed in juxtaposition along the X-direction in such a manner that the plurality of first wavefront dividing elements 91 are two-dimensionally arrayed along the XZ plane, and a plurality of exit refracting faces gab of a cylindrical surface shape formed in juxtaposition along the Z-direction in such a manner that the plurality of first wavefront dividing elements 91 are two-dimensionally arrayed along the XZ plane. The second fly's eye member 9b has a plurality of entrance refracting faces 9ba of a cylindrical surface shape formed in juxtaposition along the X-direction in such a manner that the plurality of second wavefront dividing elements 92 are two-dimensionally arrayed along the XZ plane, and a plurality of exit refracting faces 9bb of a cylindrical surface shape formed in juxtaposition along the Z-direction in such a manner that the plurality of second wavefront dividing elements 92 are two-dimensionally arrayed along the XZ plane.

The present embodiment is configured as follows in order to minimize occurrence of illuminance nonuniformity in the Y-direction in the still exposure region ER: in each of a required number of first wavefront dividing elements 91A out of the plurality of first wavefront dividing elements 91 constituting the cylindrical micro fly's eye lens 9, as shown in FIG. 13 (b), an exit refracting face 91Ab thereof is formed as inclined (or tilted) around an axis 93 along the X-direction passing an optical-axis center 91aa of an entrance face 91a of the first wavefront dividing element 91A and being perpendicular to an element optical axis AXe. A curve 91b indicated by a dashed line in FIG. 13 (b) corresponds to an exit refracting face 91b of a first wavefront dividing element 91 of an ordinary wavefront dividing element EL (cf. FIG. 13 (a)) to which the technique of the present embodiment is not applied. In this case, the exit refracting faces 91Ab of the required number of first wavefront dividing elements 91A are inclined with mutually different inclination amounts in a predetermined angular range.

As another example, the present embodiment is configured as follows in order to minimize occurrence of illuminance nonuniformity in the Y-direction in the still exposure region ER: in each of a required number of second wavefront dividing elements 92A of the wavefront dividing elements TEL to which the technique of the present embodiment is applied, as shown in FIG. 13 (c), an exit refracting face 92Ab thereof is formed as inclined around an axis 94 along the X-direction passing an optical-axis center 92aa of an entrance face 92a of the second wavefront dividing element 92A and being perpendicular to an element optical axis AXe. A curve 92b indicated by a dashed line in FIG. 13 (c) corresponds to an exit refracting face 92b of a second wavefront dividing element 92 of the ordinary wavefront dividing element EL (cf. FIG. 13 (a)) to which the technique of the present embodiment is not applied. In this case, the exit refracting faces 92Ab of the required number of second wavefront dividing elements 92A are inclined with mutually different inclination amounts in a predetermined angular range.

As still another example, which is not shown, the present embodiment is configured as follows in order to minimize occurrence of illuminance nonuniformity in the Y-direction in the still exposure region ER: in each of a required number of first wavefront dividing elements 91A of the wavefront dividing elements TEL to which the technique of the present embodiment is applied, the exit refracting face 91Ab thereof is formed as inclined around the axis 93; and in each of a required number of second wavefront dividing elements 92A of the wavefront dividing elements TEL to which the technique of the present embodiment is applied, the exit refracting face 92Ab thereof is formed as inclined around the axis 94. Namely, this embodiment is a combination of the technique shown in FIG. 13 (b) with the technique shown in FIG. 13 (c), in which the exit faces of the required number of first wavefront dividing elements are inclined and in which the exit faces of the required number of second wavefront dividing elements are inclined. In this case, the exit refracting faces of the required number of first wavefront dividing elements are inclined with mutually different inclination amounts in the predetermined angular range and the exit refracting faces of the required number of second wavefront dividing elements are inclined with mutually different inclination amounts in the predetermined angular range.

As described above, since the curved optical faces are formed as inclined in the predetermined number of wavefront dividing elements TEL in the cylindrical micro fly's eye lens 9 of the present embodiment, light passes through different regions in these tilt wavefront dividing elements TEL from those in the ordinary wavefront dividing elements EL to which the technique of the present embodiment is not applied. As a consequence, the present embodiment achieves the following effect; light passes through various regions with mutually different tendencies of surface shape errors of the optical faces even with variation in the angle and angular range of light incident to each wavefront dividing element, for example, due to movement of the movable optical members arranged upstream the cylindrical micro fly's eye lens 9, whereby occurrence of illuminance nonuniformity in the Y-direction in the still exposure region ER is minimized by the so-called averaging effect of surface shape errors.

The embodiment shown in FIG. 13 (c) is the example wherein the exit face 92Ab of the second wavefront dividing element 92A is inclined around the axis 94, but the exit face 92Ab of the second wavefront dividing element 92A may be formed as inclined around the axis along the X-direction passing the optical-axis center of the entrance face 91a of the first wavefront dividing element 91 optically conjugate with the illumination target surface, and being perpendicular to the element optical axis AXe. In this case, high illumination efficiency can be achieved without deviation of the illumination region due to the inclination of the exit face 92Ab of the second wavefront dividing element 92A.

Furthermore, FIG. 13 (b) and FIG. 13 (c) show the examples wherein the exit face of the first wavefront dividing element and the exit face of the second wavefront dividing element are inclined, but it is also possible to adopt a configuration wherein the entrance face of the first wavefront dividing element and the entrance face of the second wavefront dividing element are inclined.

In the cylindrical micro fly's eye lens 9 of the above embodiment, the entrance faces (curved entrance-side optical surfaces) of the plurality of first wavefront dividing elements in the first fly's eye member 9a and the entrance faces (curved entrance-side optical surfaces) of the plurality of second wavefront dividing elements in the second fly's eye member 9b have a refracting power in the X-direction and the exit faces (curved exit-side optical surfaces) of the plurality of first wavefront dividing elements in the first fly's eye member 9a and the exit faces (curved exit-side optical surfaces) of the plurality of second wavefront dividing elements in the second fly's eye member 9b have a refracting power in the Z-direction.

However, without having to be limited to this embodiment, another embodiment of the cylindrical micro fly's eye lens 9 may be configured as follows: the entrance faces (curved entrance-side optical surfaces) of the plurality of first wavefront dividing elements in the first fly's eye member 9a and the entrance faces (curved entrance-side optical surfaces) of the plurality of second wavefront dividing elements in the second fly's eye member 9b have a refracting power in the Z-direction, and the exit faces (curved exit-side optical surfaces) of the plurality of second wavefront dividing elements in the second fly's eye member 9b have a refracting power in the X-direction.

Still another embodiment of the cylindrical micro fly's eye lens 9 may be configured as follows: the entrance faces (curved entrance-side optical surfaces) of the plurality of first wavefront dividing elements in the first fly's eye member 9a and the exit faces (curved exit-side optical surfaces) of the plurality of first wavefront dividing elements in the first fly's eye member 9a have a refracting power in the Z-direction, and the entrance faces (curved entrance-side optical surfaces) of the plurality of second wavefront dividing elements in the second fly's eye member 9b and the exit faces (curved exit-side optical surfaces) of the plurality of second wavefront dividing elements in the second fly's eye member 9b have a refracting power in the X-direction.

Still another embodiment of the cylindrical micro fly's eye lens 9 may be configured as follows: the entrance faces (curved entrance-side optical surfaces) of the plurality of first wavefront dividing elements in the first fly's eye member 9a and the exit faces (curved exit-side optical surfaces) of the plurality of first wavefront dividing elements in the first fly's eye member 9a have a refracting power in the X-direction, and the entrance faces (curved entrance-side optical surfaces) of the plurality of second wavefront dividing elements in the second fly's eye member 9b and the exit faces (curved exit-side optical surfaces) of the plurality of second wavefront dividing elements in the second fly's eye member 9b have a refracting power in the Z-direction.

In FIG. 13 (a) to FIG. 13 (c), the first fly's eye member 9a of the cylindrical micro fly's eye lens 9 is configured so that the plurality of first wavefront dividing elements (91, 91A) are two-dimensionally arrayed along the XZ plane, but it is also possible to configure the first fly's eye member 9a, as shown in FIG. 7, so that the plurality of first wavefront dividing elements (91, 91A) are integrally formed in a single optical member. Similarly, in FIG. 13 (a) to FIG. 13 (c) the second fly's eye member 9b of the cylindrical micro fly's eye lens 9 is configured so that the plurality of second wavefront dividing elements (92, 92A) are two-dimensionally arrayed along the XZ plane, but it is also possible to configure the second fly's eye member 9b, as shown in FIG. 7, so that the plurality of second wavefront dividing elements (92, 92A) are integrally formed in a single optical member.

The aforementioned embodiment is the application of the present invention to the exposure apparatus which performs scanning exposure of the pattern in each exposure region on the wafer in accordance with the so-called step-and-scan method while moving the mask and the wafer relative to the projection optical system. However, without having to be limited to this, the present invention can also be applied to the exposure apparatus which performs sequential exposure of the pattern in shot areas on the wafer in accordance with the so-called step-and-repeat method by carrying out batch exposure while two-dimensionally driving and controlling the wafer.

In this case, the present invention may be applied to one specific direction in which occurrence of illuminance nonuniformity is desired to minimize. Specifically, a required number of curved optical faces are formed as suitably inclined around an axis perpendicular to the specific direction. Alternatively, the present invention can also be applied to two directions in which occurrence of illuminance nonuniformity is desired to minimize, when necessary. Specifically, a required number of curved optical faces are formed as suitably inclined around an axis perpendicular to a first direction and a required number of curved optical faces are formed as suitably inclined around an axis perpendicular to a second direction.

The exposure apparatus according to the foregoing embodiment is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling blocks from the various sub-systems into the exposure apparatus include mechanical connections, wire connections of electric circuits, pipe connections of pneumatic circuits, etc. between the various sub-systems. It is needless to mention that there are assembling blocks of the individual sub-systems, before the assembling blocks from the various sub-systems into the exposure apparatus. After completion of the assembling blocks from the various sub-systems into the exposure apparatus, overall adjustment is carried out to ensure various accuracies as the entire exposure apparatus. The manufacture of exposure apparatus is desirably performed in a clean room in which the temperature, cleanliness, etc. are controlled.

The exposure apparatus according to the above-described embodiment can manufacture micro devices (semiconductor devices, imaging devices, liquid crystal display devices, thin-film magnetic heads, etc.) through a process of illuminating a mask (reticle) by the illumination optical apparatus (illumination block) and exposing a photosensitive substrate with a transfer pattern formed on the mask, by the projection optical system (exposure block). An example of a method for manufacturing semiconductor devices as micro devices by forming a predetermined circuit pattern on a wafer or the like as a photosensitive substrate by means of the exposure apparatus of the above embodiment will be described below with reference to the flowchart of FIG. 14.

Figure 14:
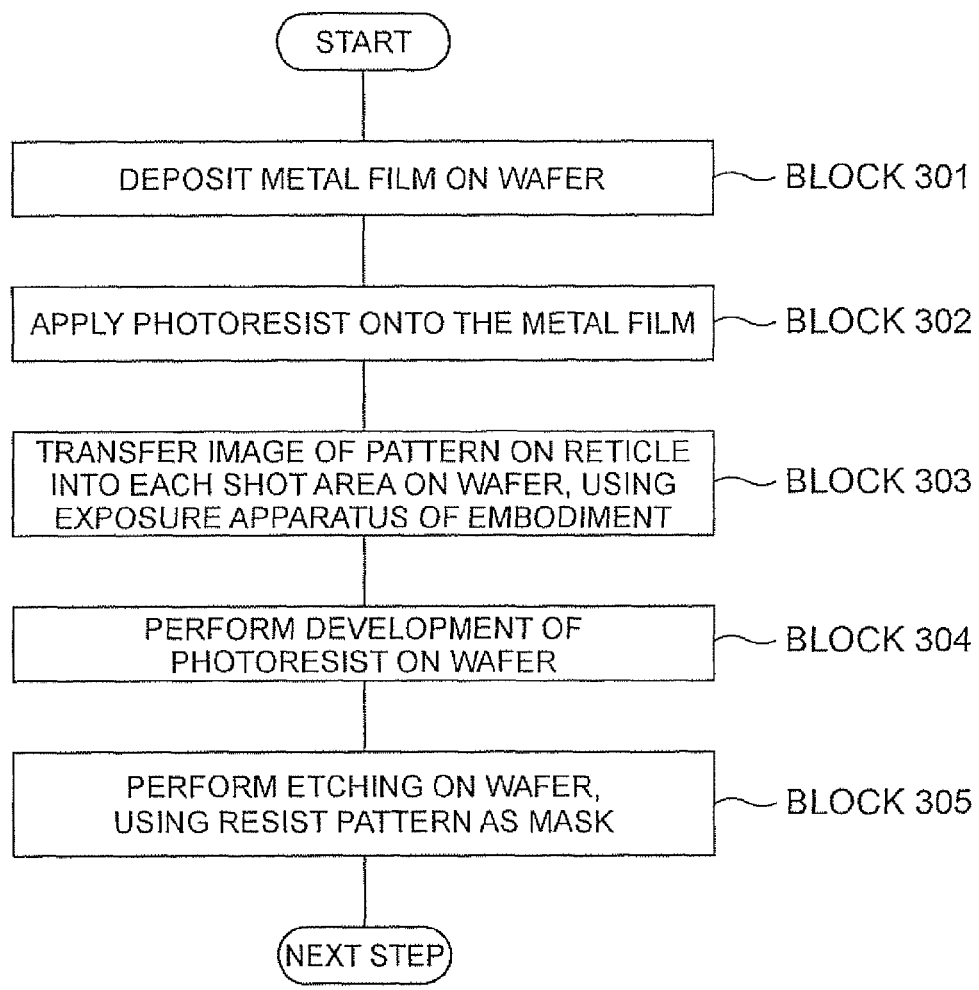
FIG. 14 is a flowchart of a method for manufacturing semiconductor devices as micro devices.

The first block 301 in FIG. 14 is to deposit a metal film on each wafer in one lot. The next block 302 is to apply a photoresist onto the metal film on each wafer in the lot. The subsequent block 303 is to use the exposure apparatus of the above embodiment to sequentially transfer an image of a pattern on a mask into each shot area on each wafer in the lot through the projection optical system of the exposure apparatus. The subsequent block 304 is to perform development of the photoresist on each wafer in the lot and the next block 305 is to perform etching using the resist pattern on each wafer in the lot as a mask, and thereby to form a circuit pattern corresponding to the pattern on the mask, in each shot area on each wafer. Thereafter, devices such as semiconductor devices are manufactured through blocks including formation of circuit patterns in upper layers. The above-described semiconductor device manufacturing method permits us to manufacture the semiconductor devices with extremely fine circuit patterns at high throughput.

Figure 15:
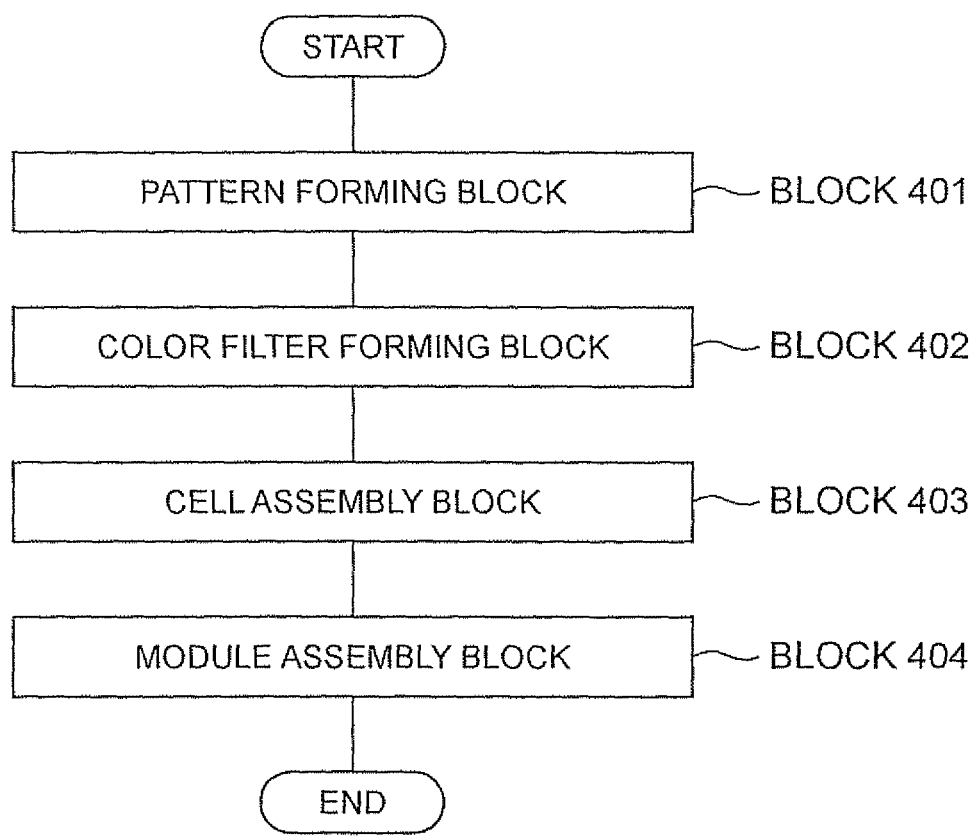
FIG. 15 is a flowchart of a method for manufacturing a liquid crystal display device as a micro device.

The exposure apparatus of the above embodiment can also manufacture a liquid crystal display device as a micro device by forming predetermined patterns (circuit pattern, electrode pattern, etc.) on plates (glass substrates). An example of a method in this case will be described below with reference to the flowchart of FIG. 15. In FIG. 15, a pattern forming block 401 is to execute the so-called photolithography block of transferring a pattern of a mask onto a photosensitive substrate (a glass substrate coated with a resist, or the like) by means of the exposure apparatus of the above embodiment. This photolithography block results in forming a predetermined pattern including a large number of electrodes and others on the photosensitive substrate. Thereafter, the exposed substrate is processed through each of blocks including a development block, an etching block, a resist removing block, etc. whereby the predetermined pattern is formed on the substrate, followed by the next color filter forming block 402.

The next color filter forming block 402 is to form a color filter in which a large number of sets of three dots corresponding to R (Red), G (Green), and B (Blue) are arrayed in a matrix pattern or in which a plurality of filter sets of three stripes of R, G, and B are arrayed in the horizontal scan line direction. After the color filter forming block 402, a cell assembling block 403 is executed. The cell assembling block 403 is to assemble a liquid crystal panel (liquid crystal cell) using the substrate with the predetermined pattern obtained in the pattern forming block 401, the color filter obtained in the color filter forming block 402, and others.

In the cell assembling block 403, the liquid crystal panel (liquid crystal cell) is manufactured, for example, by pouring a liquid crystal into between the substrate with the predetermined pattern obtained in the pattern forming block 401 and the color filter obtained in the color filter forming block 402. The subsequent module assembling block 404 is to attach various components such as electric circuits and backlights for display operation of the assembled liquid crystal panel (liquid crystal cell) to complete the liquid crystal display device. The above-described manufacturing method of the liquid crystal display device permits us to manufacture the liquid crystal display device with extremely fine circuit patterns at high throughput.

The aforementioned embodiment used the ArF excimer laser light (the wavelength: 193 nm) or the KrF excimer laser light (the wavelength: 248 nm) as the exposure light, but the exposure light does not have to be limited to these: the present invention can also be applied to any other appropriate laser light source, e.g., an $F_2$ laser light source for supplying the laser light at the wavelength of 157 nm.

The aforementioned embodiment was the application of the present invention to the optical integrator used in the illumination optical apparatus of the exposure apparatus, but, without having to be limited to this, the present invention can also be applied to any optical integrator used in commonly-used optical apparatus. The foregoing embodiment was the application of the present invention to the illumination optical apparatus for illuminating the mask or the wafer in the exposure apparatus, but, without having to be limited to this, the present invention can also be applied to commonly-used illumination optical apparatus for illuminating an illumination target surface except for the mask or the wafer.

It should be noted that the embodiment explained above was described for easier understanding of the present invention but not for restricting the present invention. Therefore, each of the elements disclosed in the above embodiment is intended to embrace all design changes and equivalents belonging to the technical scope of the present invention. Each of the constituent elements and others in the above embodiment can be applied in any combination or the like.

The invention claimed is:

1. An illumination optical system for illuminating a surface to be illuminated with light from a light source, comprising:
   an optical integrator arranged in an optical path between the light source and the surface to be illuminated and comprising a plurality of wavefront dividing elements two-dimensionally arrayed; and
   a light collecting optical system arranged between the optical integrator and the surface to be illuminated, which guides the light from the optical integrator to the surface to be illuminated, wherein
   each of the plurality of wavefront dividing elements includes at least one entrance-side optical face and at least one exit-side optical face,
   each of the plurality of wavefront dividing elements is so configured that a ray group obliquely incident to a center on an optical axis of an entrance face of each wavefront dividing element is emitted in parallel with the optical axis from the wavefront dividing element,
   in at least one wavefront dividing element out of the plurality of wavefront dividing elements, at least one curved optical face of the at least one wavefront dividing element is formed as inclined around an axis along a predetermined direction passing the optical-axis center of a predetermined entrance-side optical face of the at least one wavefront dividing element and being perpendicular to the optical axis, and
   illumination regions on the surface to be illuminated, which are illumination regions respectively illuminated with lights from the plurality of the wavefront dividing elements, are partially overlapped with respect to each other.

2. The illumination optical system according to claim 1, wherein numerical apertures of the plurality of wavefront dividing elements in exit side thereof are constant without a depending field of angle thereof.

3. The illumination optical system according to claim 2, said optical integrator comprising a single optical member in which the plurality of wavefront dividing elements are two-dimensionally arrayed,
   wherein the single optical member includes a plurality of curved entrance refracting faces formed by the plurality of wavefront dividing elements two-dimensionally arrayed, and a plurality of curved exit refracting faces formed by the plurality of wavefront dividing elements two-dimensionally arrayed.

4. The illumination optical system according to claim 2, wherein each of the wavefront dividing elements includes a first wavefront dividing element and a second wavefront dividing element,
   said optical integrator comprising a first optical member wherein a plurality of first wavefront dividing elements are two-dimensionally arrayed, and a second optical member in which a plurality of second wavefront dividing elements are two-dimensionally arrayed, in order from a light entrance side,
   wherein the first optical member includes a plurality of entrance refracting faces of a cylindrical surface shape formed in juxtaposition in one direction by the plurality of first wavefront dividing elements two-dimensionally arrayed, and a plurality of exit refracting faces of a cylindrical surface shape formed in juxtaposition in one direction by the plurality of first wavefront dividing elements two-dimensionally arrayed, and
   wherein the second optical member includes a plurality of entrance refracting faces of a cylindrical surface shape formed in juxtaposition in one direction by the plurality of second wavefront dividing elements two-dimensionally arrayed, and a plurality of exit refracting faces of a cylindrical surface shape formed in juxtaposition in one direction by the plurality of second wavefront dividing elements two-dimensionally arrayed.

5. The illumination optical system according to claim 4, wherein in at least one first wavefront dividing element out of the plurality of first wavefront dividing elements, an exit-side curved optical face of the at least one first wavefront dividing element is formed as inclined around an axis along a predetermined direction passing an optical-axis center of an entrance-side optical face of the at least one first wavefront dividing element and being perpendicular to the optical axis.

6. The illumination optical system according to claim 5, wherein in at least one second wavefront dividing element out of the plurality of second wavefront dividing elements, an exit-side curved optical face of the at least one second wavefront dividing element is formed as inclined around an axis along a predetermined direction passing an optical-axis center of an entrance-side optical face of the at least one second wavefront dividing element and being perpendicular to the optical axis.

7. The illumination optical system according to claim 6, wherein in at least one second wavefront dividing element out of the plurality of second wavefront dividing elements, an exit-side curved optical face of the at least one second wavefront dividing element is formed as inclined around an axis of a predetermined direction passing an optical-axis center of an entrance-side optical face in the first wavefront dividing element located on the entrance side of the at least one second wavefront dividing element and being perpendicular to the optical axis.

8. The illumination optical system according to claim 4, wherein at least one curved, inclined optical face of the wavefront dividing element comprises a predetermined entrance-side optical face of the wavefront dividing element.

9. The illumination optical system according to claim 1, wherein each of the wavefront dividing elements includes a first wavefront dividing element and a second wavefront dividing element, said optical integrator comprising a first optical member wherein a plurality of first wavefront dividing elements are two-dimensionally arrayed, and a second optical member in which a plurality of second wavefront dividing elements are two-dimensionally arrayed, in order from a light entrance side, wherein the first optical member includes a plurality of entrance refracting faces of a cylindrical surface shape formed in juxtaposition in one direction by the plurality of first wavefront dividing elements two-dimensionally arrayed, and a plurality of exit refracting faces of a cylindrical surface shape formed in juxtaposition in one direction by the plurality of first wavefront dividing elements two-dimensionally arrayed, and wherein the second optical member includes a plurality of entrance refracting faces of a cylindrical surface shape formed in juxtaposition in one direction by the plurality of second wavefront dividing elements two-dimensionally arrayed, and a plurality of exit refracting faces of a cylindrical surface shape formed in juxtaposition in one direction by the plurality of second wavefront dividing elements two-dimensionally arrayed.

10. The illumination optical system according to claim 9, wherein in at least one first wavefront dividing element out of the plurality of first wavefront dividing elements, an exit-side curved optical face of the at least one first wavefront dividing element is formed as inclined around an axis along a predetermined direction passing an optical-axis center of an entrance-side optical face of the at least one first wavefront dividing element and being perpendicular to the optical axis.

11. The illumination optical system according to claim 9, wherein in at least one second wavefront dividing element out of the plurality of second wavefront dividing elements, an exit-side curved optical face of the at least one second wavefront dividing element is formed as inclined around an axis along a predetermined direction passing an optical-axis center of an entrance-side optical face of the at least one second wavefront dividing element and being perpendicular to the optical axis.

12. The illumination optical system according to claim 9, wherein in at least one second wavefront dividing element out of the plurality of second wavefront dividing elements, an exit-side curved optical face of the at least one second wavefront dividing element is formed as inclined around an axis of a predetermined direction passing an optical-axis center of an entrance-side optical face in the first wavefront dividing element located on the entrance side of the at least one second wavefront dividing element and being perpendicular to the optical axis.

13. The illumination optical system according to claim 9, wherein at least one curved, inclined optical face of the wavefront dividing element comprises a predetermined entrance-side optical face of the wavefront dividing element.

14. The illumination optical system according to claim 1, wherein at least one curved, inclined optical face of the wavefront dividing element comprises a predetermined entrance-side optical face of the wavefront dividing element.

15. The illumination optical system according to claim 1, comprising a movable optical member movably arranged in an optical path between the light source and the optical integrator.

16. An exposure apparatus comprising the illumination optical system as set forth in claim 1, for illuminating a predetermined pattern, said exposure apparatus performing exposure of a photosensitive substrate with the predetermined pattern.

17. A device manufacturing method comprising:
exposing the photosensitive substrate with the predetermined pattern, using the exposure apparatus as set forth in claim 16; and
developing the exposed photosensitive substrate.

18. The exposure apparatus according to claim 16, comprising a projection optical system for forming an image of the predetermined pattern on the photosensitive substrate, wherein the predetermined pattern and the photosensitive substrate are moved along a scanning direction relative to the projection optical system whereby the predetermined pattern is projected onto the photosensitive substrate to effect projection exposure of the photosensitive substrate with the predetermined pattern.

19. The exposure apparatus according to claim 18, wherein the predetermined direction in the optical integrator corresponds to a direction perpendicular to a scanning direction.

* * * * *